(12) United States Patent
Sato et al.

(10) Patent No.: US 7,119,382 B2
(45) Date of Patent: Oct. 10, 2006

(54) HETEROBIPOLAR TRANSISTOR AND METHOD OF FABRICATING THE SAME

(75) Inventors: Hidekazu Sato, Kawasaki (JP); Takae Sukegawa, Kawasaki (JP); Kousuke Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 113 days.

(21) Appl. No.: 10/413,394

(22) Filed: Apr. 15, 2003

(65) Prior Publication Data

US 2003/0201461 A1 Oct. 30, 2003

(30) Foreign Application Priority Data

Apr. 30, 2002 (JP) ............... 2002-129062
Sep. 18, 2002 (JP) ............... 2002-271172

(51) Int. Cl.
*H01L 31/0328* (2006.01)
*H01L 29/06* (2006.01)

(52) U.S. Cl. .................. 257/197; 257/19; 257/198; 257/199; 257/20; 438/235; 438/309; 438/317

(58) Field of Classification Search ............... 257/94, 257/95, 96, 565, 591, 197
See application file for complete search history.

(56) References Cited

U.S. PATENT DOCUMENTS

| | | | |
|---|---|---|---|
| 6,410,975 B1 * | 6/2002 | Racanelli | 257/591 |
| 6,459,107 B1 * | 10/2002 | Sugiyama et al. | 257/226 |
| 6,492,711 B1 * | 12/2002 | Takagi et al. | 257/593 |
| 6,670,654 B1 * | 12/2003 | Lanzerotti et al. | 257/197 |
| 6,759,697 B1 * | 7/2004 | Toyoda et al. | 257/197 |
| 2002/0158311 A1 * | 10/2002 | Ohnishi et al. | 257/591 |
| 2002/0182423 A1 * | 12/2002 | Chu et al. | 428/446 |
| 2002/0185656 A1 * | 12/2002 | Aoki | 257/197 |
| 2003/0006484 A1 * | 1/2003 | Asai et al. | 257/565 |
| 2003/0071281 A1 * | 4/2003 | Lippert et al. | 257/200 |

FOREIGN PATENT DOCUMENTS

| | | |
|---|---|---|
| JP | 04-106980 | 4/1992 |
| JP | 2000-77425 | 3/2000 |
| JP | 2001-189321 | 7/2001 |
| JP | 2001-319936 | 11/2001 |
| JP | 2001-326230 | 11/2001 |
| JP | 2002-158232 | 5/2002 |
| JP | 2003-297844 | 10/2003 |

OTHER PUBLICATIONS

*Transistor Noise Figure*: H. F. Cooke, Solid State Design, Feb. 1963, pp. 37-42.
*Microwave Transistor*: H.F. Cooke, Theory and Design, Proceedings of the IEE, vol. 59, No. 8, Aug. 1971, pp. 1163-1181.

(Continued)

*Primary Examiner*—Nathan Flynn
*Assistant Examiner*—Fazli Erdem
(74) *Attorney, Agent, or Firm*—Westerman, Hattori, Daniels & Adrian, LLP.

(57) ABSTRACT

The present invention realizes a heterobipolar transistor using a SiGeC base layer in order to improve its electric characteristics. Specifically, the distribution of carbon and boron within the base layer is controlled so that the concentration of boron is higher than the concentration of carbon on the side bordering on the emitter layer, and upon the formation of the emitter layer, both boron and carbon are dispersed into a portion of the emitter layer that comes into contact with the base layer.

24 Claims, 17 Drawing Sheets

OTHER PUBLICATIONS

Lanzerotti et al., "Suppression of boron transient enhanced diffusion in SiGe heterojunction bipolar transistors by carbon incorporation"; Appl. Phys. Lett. 70 (23), Jun. 9, 1997, pp. 3125-3127.

Osten et al., "Effects of carbon on boron diffusion in SiGe: Principles and impact on bipolar devices"; J. Vac. Sci. Technol. B 16(3), May/Jun. 1998, pp. 1750-1753.

* cited by examiner

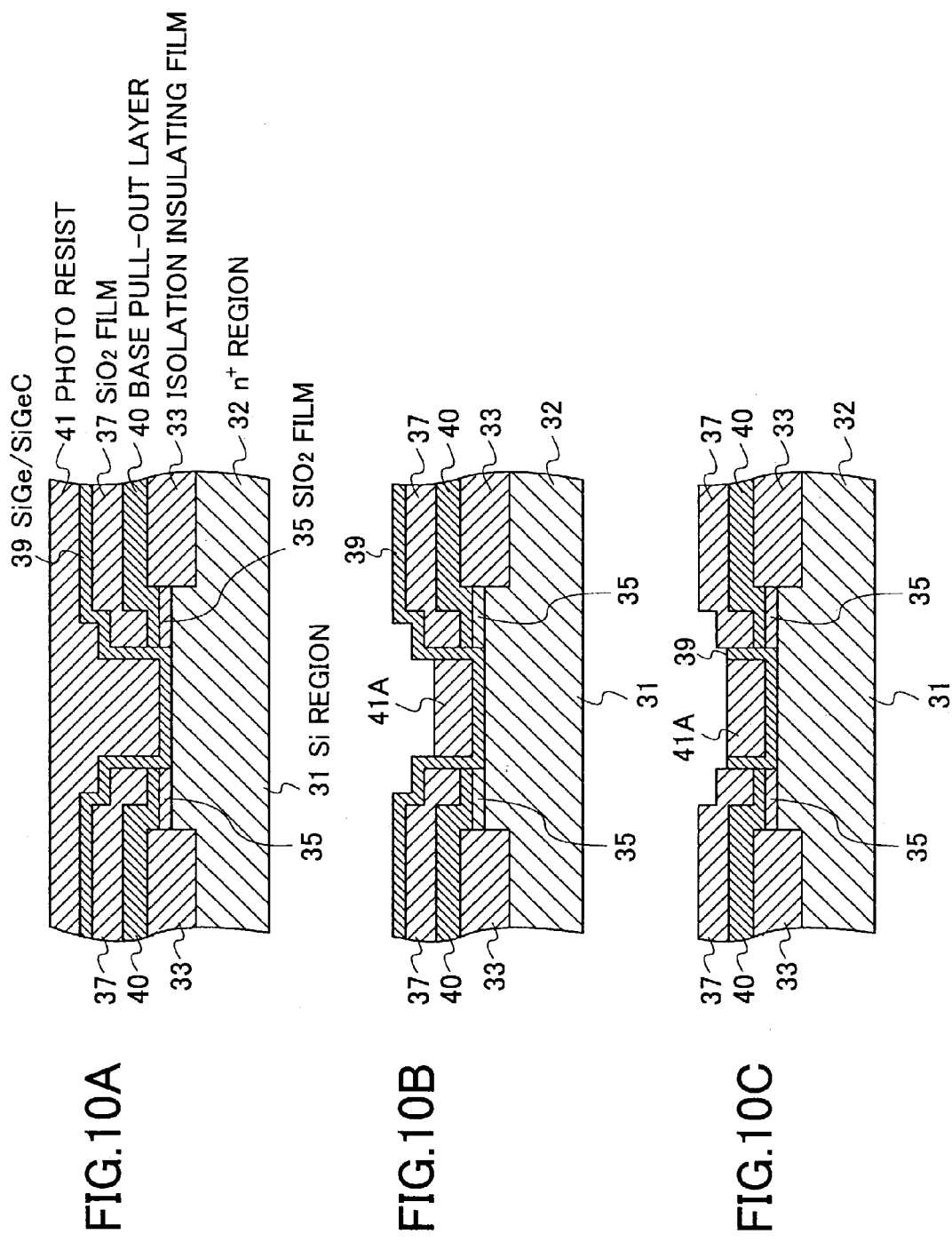

HETEROBIPOLAR TRANSISTOR AND METHOD OF FABRICATING THE SAME

CROSS-REFERENCE TO RELATED APPLICATIONS

This patent application is based on and claims the benefit of the earlier filing date of Japanese Patent application No. 2002-129062, filed Apr. 30, 2002 and Japanese Patent application No. 2002-271172, filed Sep. 18, 2002, the entire contents of which are hereby incorporated by reference.

BACKGROUND OF THE INVENTION

1. Field of the Invention

The present invention relates generally to a semiconductor device and particularly to a high speed semiconductor device having a SiGeC ternary mixed crystal semiconductor layer.

2. Description of the Related Art

Today, the silicon (Si) bipolar transistor is a classic semiconductor device. In the conventional silicon (Si) bipolar transistor, the carrier mobility within silicon is very limited which in turn limits the operational speed of the device. Therefore, a compound semiconductor device employing a compound semiconductor material with large electron mobility in the active region is generally being used in optical communication systems or wireless communication systems such as mobile phones, demanding high speed operation at a bandwidth of several dozen GHz.

On the other hand, the integration of a compound semiconductor device onto a silicon substrate is quite difficult; thus, in the conventional high speed communication system, the high frequency circuit that operates in a GHz band has to be separated from the signal processing part composed of a silicon integrated circuit.

It is known that a wide range of mixed crystals can be formed between silicon (Si) and germanium (Ge), and a high speed semiconductor device using a SiGe binary mixed crystal in the active layer is being proposed. In the SiGe binary mixed crystal, distortion occurs due to the difference in the atom radius between the silicon (Si) and germanium (Ge). However, as a result of the above distortion, the symmetry of the crystals forming the mixed crystal decreases and the electrons are prevented from scattering, thereby greatly increasing the mobility of the carriers. A high speed semiconductor device using the above SiGe binary mixed crystal can be integrated with other silicon (Si) semiconductor devices onto a common silicon (Si) substrate, and is therefore quite advantageous.

In the SiGe binary mixed crystal, the band gap decreases due to the substitution by germanium (Ge) in the silicon (Si) crystal; however, by doping the SiGe mixed crystal into a p-type dopant and using this as the base layer of the silicon (Si) bipolar transistor, a band discontinuity that prevents the entering of the minority carriers into the emitter domain can be formed on the valence band side in between the base and the emitter layers. As a result, the emitter injection efficiency can be improved and high speed response characteristics can be realized in the above SiGe heterobipolar transistor, as in the conventional compound semiconductor heterobipolar transistor.

FIG. 1A shows the structure of a heterobipolar transistor 10 using the conventional SiGe binary mixed crystal; and FIG. 1B shows the band structure of the heterobipolar transistor 10 of FIG. 1A.

As shown in FIG. 1A, the heterobipolar transistor 10 is formed on a silicon (Si) substrate 11 that has element isolation trenches 11A and an $n^+$ type well 11B. On the $n^+$ type well 11B, an n-type silicon (Si) collector layer 12 and a thin base layer 13 that is made of a p-type SiGe binary mixed crystal, are formed in this order. The collector layer 12 and the base layer 13 form a mesa structure, and on the base layer 13, an $n^+$ type silicon (Si) emitter layer 14 is formed. Typically, the collector layer 12 and the emitter layer 14 are doped with phosphorous (P) or arsenic (As) to a carrier density of approximately $5 \times 10^{17}$ cm$^{-3}$ and $3 \times 10^{20}$ cm$^{-3}$, respectively. On the other hand, the base layer 13 is doped by boron (B) to a carrier density of approximately $5 \times 10^{18}$ cm$^{-3}$ or above. On the emitter layer 14, an emitter electrode 15 is formed; on the base layer 13, base electrodes 16 are formed; and on the $n^+$ type well 11B, collector electrodes 17 are formed. Thus, in the structure of FIG. 1A, the $n^+$ type well 11B forms a collector contact layer.

As shown in the band structure drawing of FIG. 1B, the germanium (Ge) concentration in the base layer 13 changes so that it increases in the direction from the interface of the base layer 13 and the emitter layer 14 to the interface of the base layer 13 and the collector layer 12. As a result, the conduction band Ec in the base layer 13 tilts towards the collector layer 12. By having the above-described tilted structure in the base layer 13, the electrons are sped up upon passing the base layer 13 through dispersion due to the drift electric field caused by this tilt of the conduction band Ec. As a result, the operation speed of the bipolar transistor 10 can be increased. The heterobipolar transistor using the above-described SiGe binary mixed crystal is disclosed, for example, in U.S. Pat. No. 5,353,912.

The heterobipolar transistor 10 of FIGS. 1A and 1B is formed on the silicon (Si) substrate using a well-known technique in the field of silicon (Si) integrated circuits. Therefore, it can be easily integrated with other information processing circuits including analog circuits.

However, in the heterobipolar transistor 10 of FIGS. 1A and 1B, boron (B) used in the doping process of the base layer 13 is easily dispersed into the neighboring collector layer 12 or the emitter layer 14. Thus, this heterobipolar transistor is unstable for thermal processing.

In response to the above problem, a technique of incorporating a small amount of C (carbon) as a dopant to the SiGe binary mixed crystal base layer 13 so as to prevent the dispersion of B (boron) into the neighboring collector layer 12 or the emitter layer 14 has been proposed in the conventional art (refer to: Lanzerotti, et al., Appl. Phys. Lett. 70(23), Jun. 9, 1997; Osten, H. J., et al., J. Vac. Sci. Technol. B16(3), May/June 1998, pp. 1750–1753).

Specifically, in the heterobipolar transistor controlled to have an ideal distribution of B (boron) in the base layer 13 by incorporating C (carbon) with a controlled distribution profile, the thickness of the base layer 13 can be minimized and the dopant concentration in the base layer 13 can be maximized. In this way, excellent operational characteristics can be expected.

However, in the heterobipolar transistor, controlled to have an ideal distribution of B (boron) in the SiGeC base layer 13, that has actually been created by the inventors of the present invention, the noise figure (NF) obtained according to formula 1, disclosed below, is degraded to a value of approximately 0.8–1.2 dB and particularly, the S/N ratio in the high frequency band including the GHz band is notably degraded.

$$NF = 1 \left| \frac{r_b'}{r_g} \right| \frac{r_e}{2r_g} \left| \cdot \frac{(r_g + r_b' + r_e)^2}{2a_0 r_e r_g} \left( \frac{f}{1.2 f_T} \left| \frac{1}{h_{FE}} \right| \frac{I_{cb}}{I_E} \right) \right. \quad (1)$$

(H. F. Cooke, Solid State Design, February 1963, pp. 37–42) Note that in the above formula 1, $r_g$ denotes the signal source impedance, $r_b'$ denotes the base resistance, $r_e$ denotes the emitter resistance, and $a_0$ denotes the base ground current gain.

According to formula 1, the NF of the heterobipolar transistor can be reduced by decreasing the base resistance $r_b'$ and the emitter resistance $r_e$. Thus, by controlling the distribution of carbon (C) in the base layer 13 and by controlling the distribution of boron (B) so that the density of boron (B) is maximized in the base layer 13 and the base resistance $r_b'$ minimized, and also, so that the penetration of boron (B) into the emitter layer 14 is prevented and the emitter resistance minimized, the NF of the heterobipolar transistor can supposedly be reduced.

However, in the heterobipolar transistor with the distribution of boron (B) in the above-described SiGeC base layer 13 controlled to be in an ideal state, the NF is degraded to a value of approximately 0.8–1.2 dB and particularly, the S/N ratio in the high frequency band including the GHz band is notably degraded, as previously mentioned.

FIG. 2 shows the results of an analysis of the distribution of boron (B), carbon (C), and germanium (Ge) in the collector layer 12 and the base layer 13 of the heterobipolar transistor having the structures shown in FIGS. 1A and 1B, the analysis being made through SIMS (secondary ion mass spectrometry), wherein the n-type collector layer 12 and the base layer 13 doped into p-type layers by B (boron) are successively formed in this order through the use of the low pressure CVD technique.

In the state of the heterobipolar transistor shown in FIG. 2, that is, the state before the formation of the emitter layer 14 and right after the formation of the base layer 13, a SiGe mixed crystal region 13A, which does not include carbon (C) and boron (B), is formed at the lower portion of the base layer 13 around the boundary with the collector layer 12, and a SiGeC mixed crystal region 13B including carbon (C) and boron (B) is formed thereon. Also, in the region 13B, the concentration of carbon (C) is higher than the concentration of boron (B), and the distribution of boron (B) is limited to the range in which carbon (C) is distributed.

FIG. 3 shows the distribution of germanium (Ge) carbon (C), boron (B), and phosphorous (P), wherein the n-type emitter layer 14, which has been doped with P (phosphorous), is formed onto the structure of FIG. 2 using the low pressure CVD technique, after which a thermal process (700–800° C.) corresponding to the formation process of the CVD insulating film for the actual fabrication of the device is performed (refer to FIG. 11B, which is to be described later on), followed by a rapid thermal annealing (RTA) process at 900–1000° C. corresponding to the actual fabrication process of the device.

FIG. 12 is another diagram showing the distribution of the elements within the layers upon the creation of the heterobipolar transistor having the structure of FIG. 1. FIG. 2 shows the results from a SMIS analysis of the layers of the heterobipolar transistor in a state where each of the layers is deposited. The analyzing capabilities of FIG. 2 in a direction along the depth of the layers is somewhat limited. Thus, FIG. 12 shows a more accurate analysis of the distribution of the elements within the layers.

With reference to FIG. 3 and FIG. 12, the low pressure CVD process upon the formation of the insulating film is accompanied by the dispersion of C (carbon) in the base layer 13B into the entire base layer 13 so that the distinction between the regions 13A and 13B of FIG. 2 disappears so as to form a single base layer 13. As a result, the B (boron) is also dispersed in comparison with the state in FIG. 2; however, its distribution profile corresponds to that of carbon (C) and is precisely controlled so that boron (B) will not enter the emitter layer 14. Also, as shown in FIG. 12, a concentration gradient of germanium (Ge) does not exist on the collector layer 12 side of the base layer 13, and the germanium (Ge) concentration suddenly increases at the interface of the collector layer 12 and the base layer 13 from 0% to 16%, for example. Additionally, as indicated in FIG. 12, the germanium (Ge) concentration gradient on the emitter layer 14 side of the base layer 13 is not fixed, and the germanium (Ge) concentration suddenly decreases around the interface of the base layer 13 and the emitter layer 14 from 5–10% to 0%. Further, as indicated in FIG. 3, there is hardly any difference between the distribution profile of germanium (Ge) in the base layer 13 before and after the formation of the emitter layer 14.

However, the above distribution of carbon (C) prevents an ideal distribution of boron (B). In the heterobipolar transistor having a structure in which boron (B) is trapped inside the base layer 13, the desired characteristics cannot be obtained as previously mentioned.

SUMMARY OF THE INVENTION

In response to the above-described problems of the conventional art, the general object of the present invention is to provide a new and useful semiconductor device. Specifically, the present invention aims at realizing a heterobipolar transistor having a SiGe binary mixed crystal as its base, wherein the NF characteristics can be improved and a desirable S/N ratio can be obtained.

To this end, the present invention provides a heterobipolar transistor having an n-type silicon collector layer; a base layer made of a p-type SiGeC mixed crystal layer, doped with boron and formed on the n-type silicon collector layer; and an n-type silicon emitter layer formed on the base layer and containing boron at a concentration exceeding $7 \times 10^{17}$ cm$^{-3}$.

According to this invention, a moderate distribution of boron and a moderate pn junction occurs at the interface of the base layer and the emitter layer and a portion of the boron enters into the emitter layer. As a result, a heterobipolar transistor having an excellent noise figure, particularly in the high frequency band, can be obtained.

In the present invention, the concentration of boron in the base layer is set to be higher than the concentration of carbon at least in the region including the boundary between the emitter layer and the base layer. Also, the emitter layer may contain carbon around the border with the base layer. On the other hand, the emitter layer may be doped by phosphorous. Also, in the collector layer, a region including the border with the base layer is doped so as to obtain a higher concentration of carbon than the concentration of boron. In this way, boron is prevented from being dispersed into the collector layer. The above emitter layer is preferably made of material that has a wider gap than the material of the base layer, which contains substantially no germanium, so that a desirable heterobipolar operation can be realized.

Also, the present invention provides a heterobipolar transistor fabrication method including the steps of forming an n-type collector layer by forming a first n-type silicon layer on a substrate; forming a p-type base layer by depositing a SiGeC mixed crystal layer containing boron on the n-type collector layer so that the concentration of carbon exceeds the concentration of boron, and then depositing the SiGeC mixed crystal layer so that the concentration of boron exceeds the concentration of carbon; and forming an emitter layer by depositing a second n-type silicon layer on the p-type base layer.

According to this invention, the boron contained within the base layer is dispersed into the emitter layer upon forming the emitter layer onto the base layer, a moderate distribution of boron and a moderate pn junction occurs at the interface of the base layer and the emitter layer, and a portion of the boron enters into the emitter layer at a concentration above $7 \times 10^{17}$ cm$^{-3}$. As a result, a heterobipolar transistor having an excellent noise figure, particularly in the high frequency band, can be obtained.

In the step of forming the p-type base layer according to the present invention, a SiGe mixed crystal film is preferably deposited after the deposition of the SiGeC mixed crystal layer for realizing a higher concentration of boron compared to the concentration of carbon. In this way, boron is able to be dispersed into the emitter layer through the SiGe mixed crystal layer, which does not contain any carbon. Here, carbon is also dispersed from the SiGeC mixed crystal layer, thereby preventing an uncontrollable dispersion of boron. Also, in the step of forming the p-type base layer, preferably, another SiGeC film is deposited on the n-type collector layer before the deposition of the SiGeC mixed crystal layer for realizing a higher concentration of carbon compared to the concentration of boron. In this way, the dispersion of boron into the collector layer can be effectively controlled. Further, in the step of forming the silicon emitter layer, the second n-type silicon layer is preferably deposited directly onto the base layer. Boron can be dispersed from the base layer into the emitter layer in this case as well. The above steps of depositing the first n-type silicon layer, the SiGeC mixed crystal layer, and the second n-type silicon layer can be performed using the low-pressure CVD technique.

BRIEF DESCRIPTION OF THE DRAWINGS

FIGS. 10A–10C are diagrams illustrating the fabrication process of the heterobipolar transistor according to the second embodiment of the present invention (part 2);

DESCRIPTION OF THE PREFERRED EMBODIMENTS

First Embodiment

In the following, the heterobipolar transistor according to the first embodiment of the present invention is described.

Figure 4:
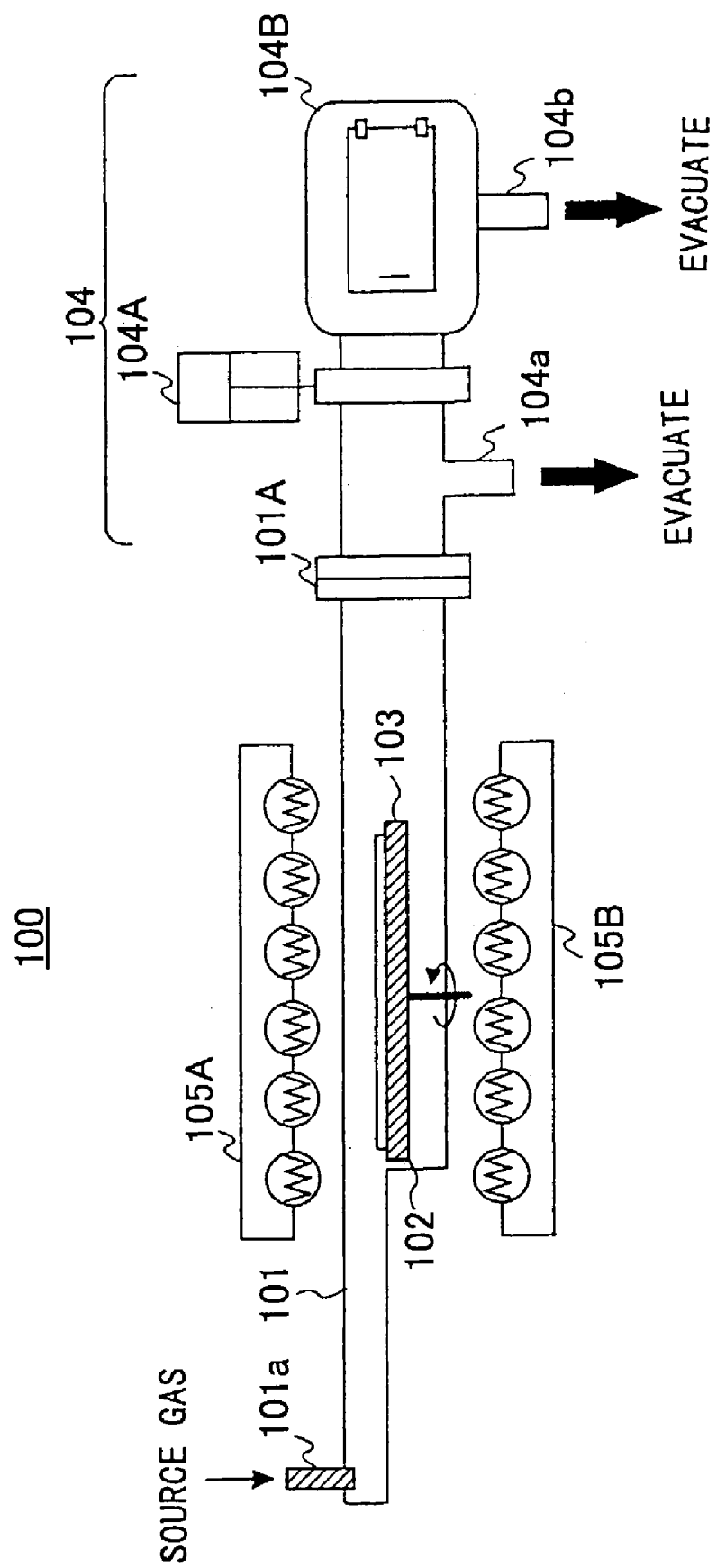
FIG. 4 is a diagram illustrating the structure of a vapor deposition apparatus used in the present invention.

FIG. 4 shows the structure of the vapor deposition apparatus 100 used in the present invention.

In FIG. 4, the vapor deposition apparatus 100 includes a quartz reactor 101 having a graphite susceptor 102 that can rotate freely, and a processing substrate 103 such as a Si (silicon) wafer, which is to be processed in the above apparatus, is placed on the graphite susceptor 102. In this drawing, the graphite susceptor 102 is covered by a SiC film, not shown in the drawing.

The quartz reactor 101 is connected, via a flange 101A, to a wafer enter/exit part 104, having a gate valve 104A and a load lock chamber 104B, and air is evacuated from the quartz reactor 101 via an evacuation port 104a, which is implemented in the wafer enter/exit part 104. Also, air is evacuated from the load lock chamber 104B via another evacuation port 104b. Additionally, vapor material is introduced into the quartz reactor 101 via a material injection port 101a. Further, lamp heaters 105A and 105B for heating the processing substrate 103 placed on the susceptor 102 are stationed adjacent to the quartz reactor 101.

In the following, the formation process of a SiGeC ternary mixed crystal layer onto a Si (silicon) substrate using the vapor deposition apparatus 100 of FIG. 4 is described.

First, a Si (silicon) substrate having a cleaned surface, a (100) surface, for example, is introduced into the quartz reactor 101 as the processing substrate 103 via the load lock chamber 104B and the gate valve 104A. Then the surface oxide film is cleaned at the susceptor 102 by baking the processing substrate 103 at a temperature of 950° C. in a $H_2$ carrier gas atmosphere.

Next, the substrate temperature of the processing substrate 103 is lowered to 550–650° C., and $SiH_4$ as the material for Si (silicon), $GeH_4$ as the material for Ge (germanium), and $(CH_3)SiH_3$ (mono methyl silane) as the material for C (carbon) are injected from the material injection port 101a into the quartz reactor 101 along with dopant gas $B_2H_6$. Further, the internal pressure of the quartz reactor 101 is set to approximately 10 kPa (80 Torr) to form a SiGeC type mixed crystal layer on the processing substrate 103.

In the present invention, using the vapor deposition apparatus 100, $SiH_4$ is first supplied to substantially cover the substrate surface with Si (silicon) atoms, then, the material of C (carbon) such as $(CH_3)SiH_3$ is supplied so that C (carbon) atoms enter into the desirable grid positions, after which $GeH_4$ is supplied to incorporate Ge (germanium) atoms. In the above-described process, it is possible to supply C (carbon) atoms in the SiGeC mixed crystal at a stable and high concentration. By repeating the above-described process, a SiGeC mixed crystal having C (carbon) atoms at the desired grid position and at a high concentration can be formed. According to the above process, the desired SiGeC mixed crystal can be formed using any formation profile.

Figure 1A:
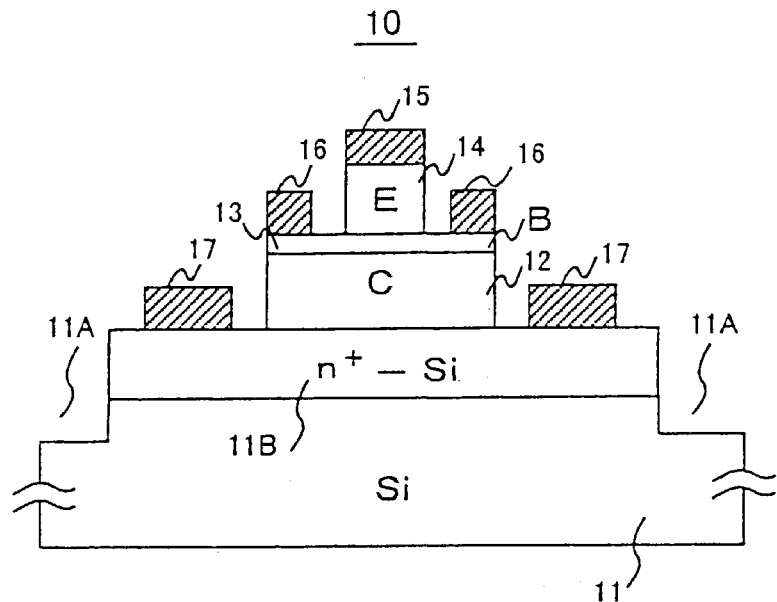
FIGS. 1A and 1B are diagrams illustrating the structure and operation of the SiGeC heterobipolar transistor according to the conventional art.
Figure 1B:
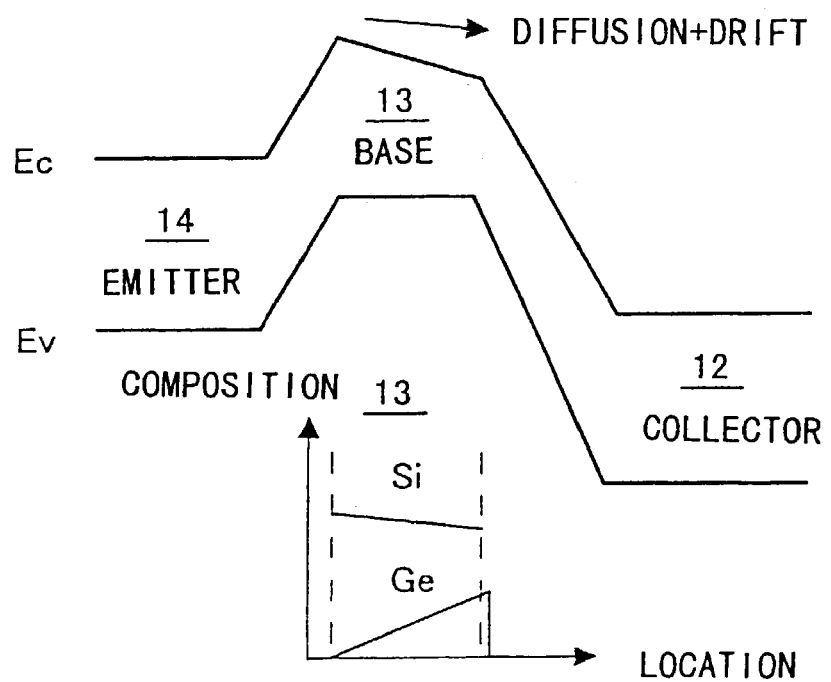
Figure 2:
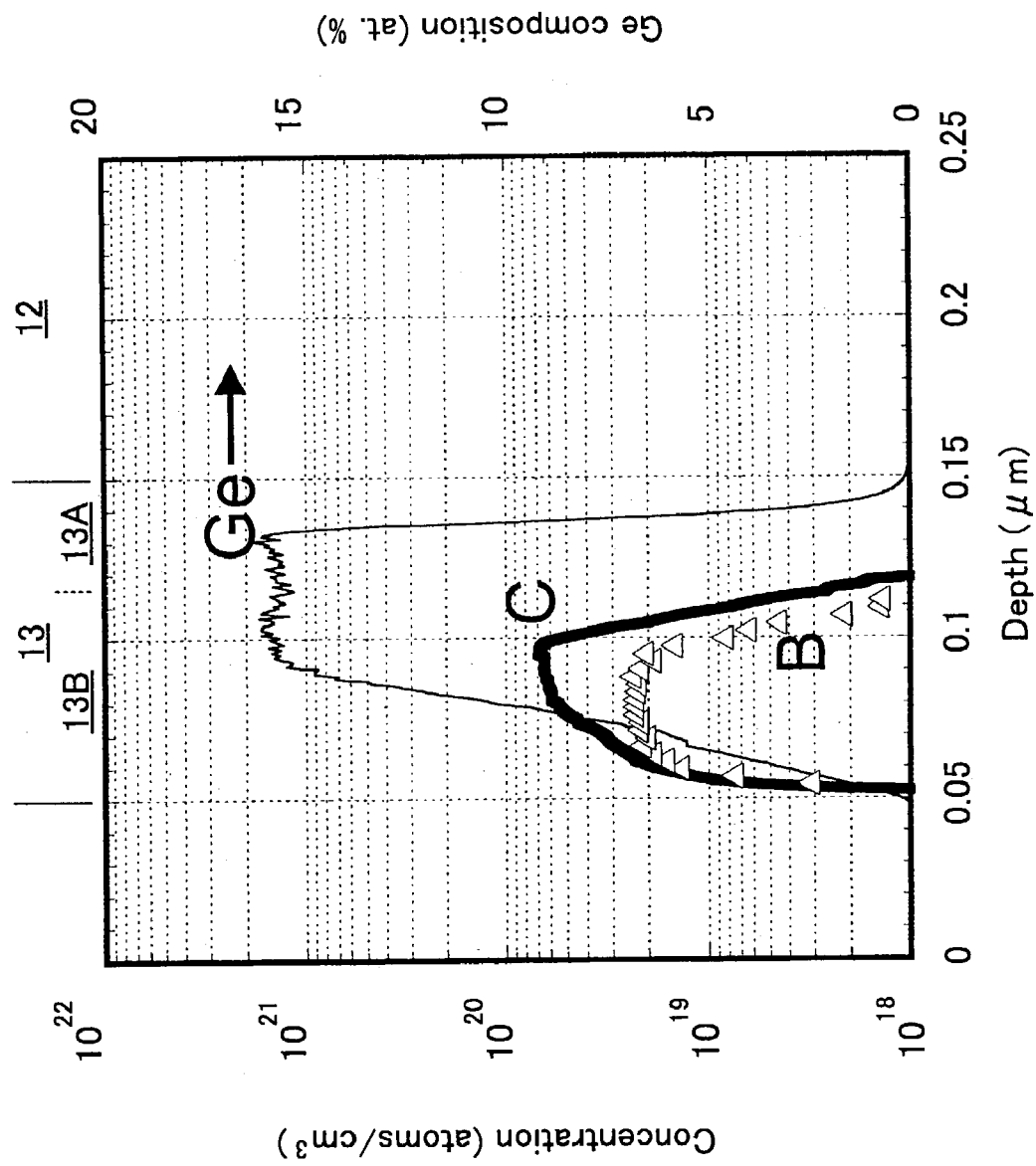
FIG. 2 is a diagram showing the element distribution in the films upon creating the heterobipolar transistor having the structure of FIG. 1.
Figure 3:
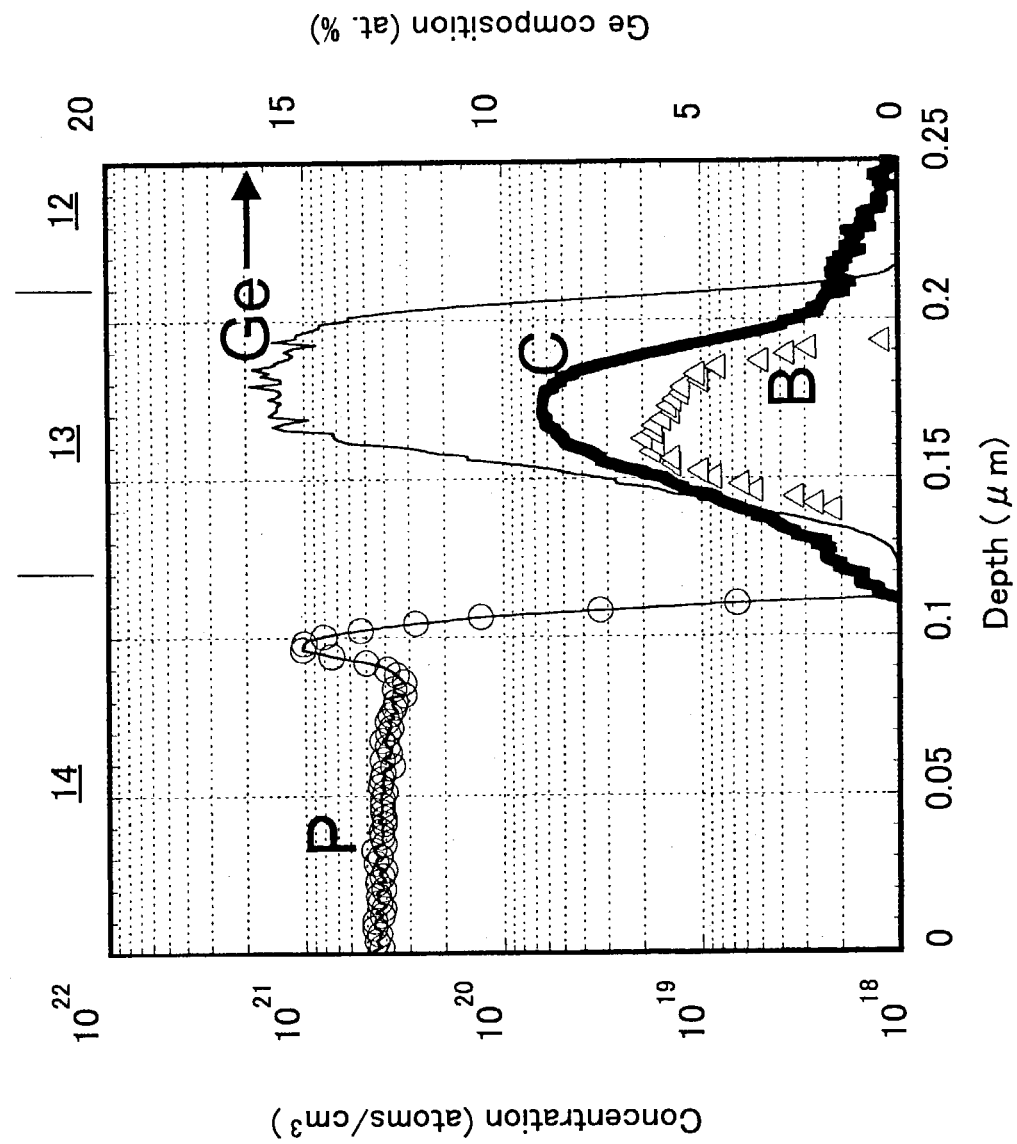
FIG. 3 is another diagram showing the element distribution in the films upon creating the heterobipolar transistor having the structure of FIG. 1.
Figure 5:
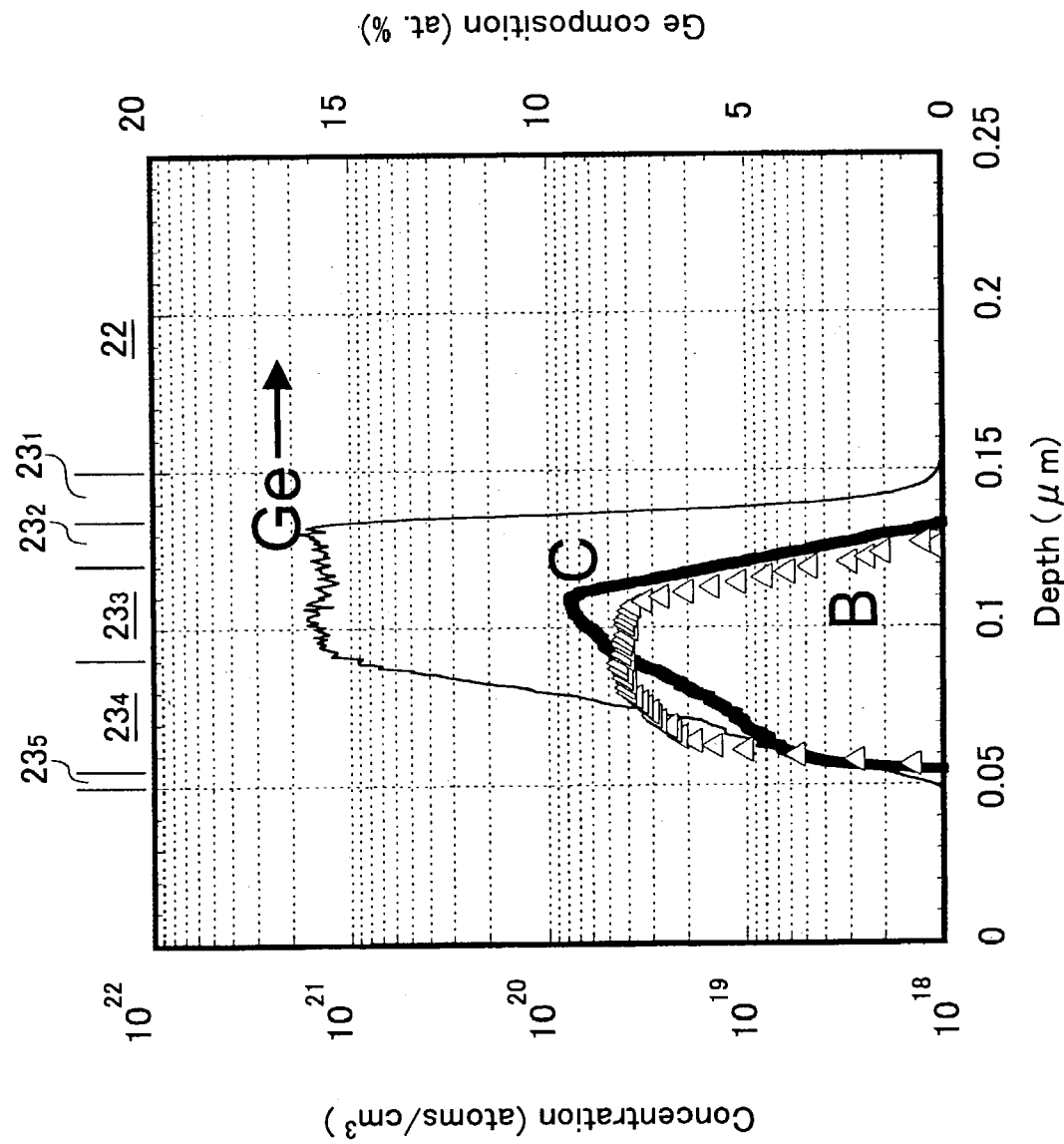
FIG. 5 is a diagram showing the element distribution in the films of the heterobipolar transistor according to the first embodiment of the present invention.
Figure 6:
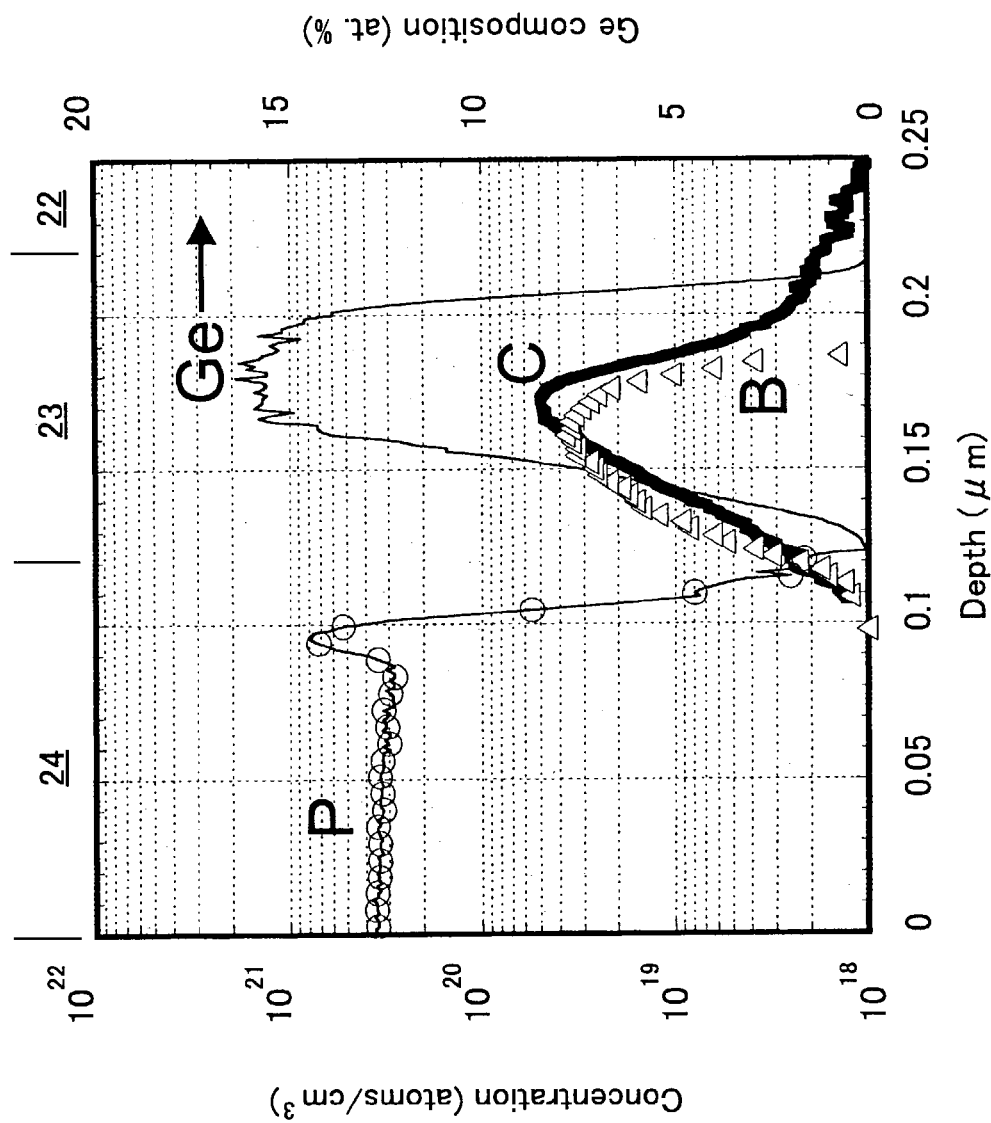
FIG. 6 is another diagram showing the element distribution in the films of the heterobipolar transistor according to the first embodiment of the present invention.
Figure 7:
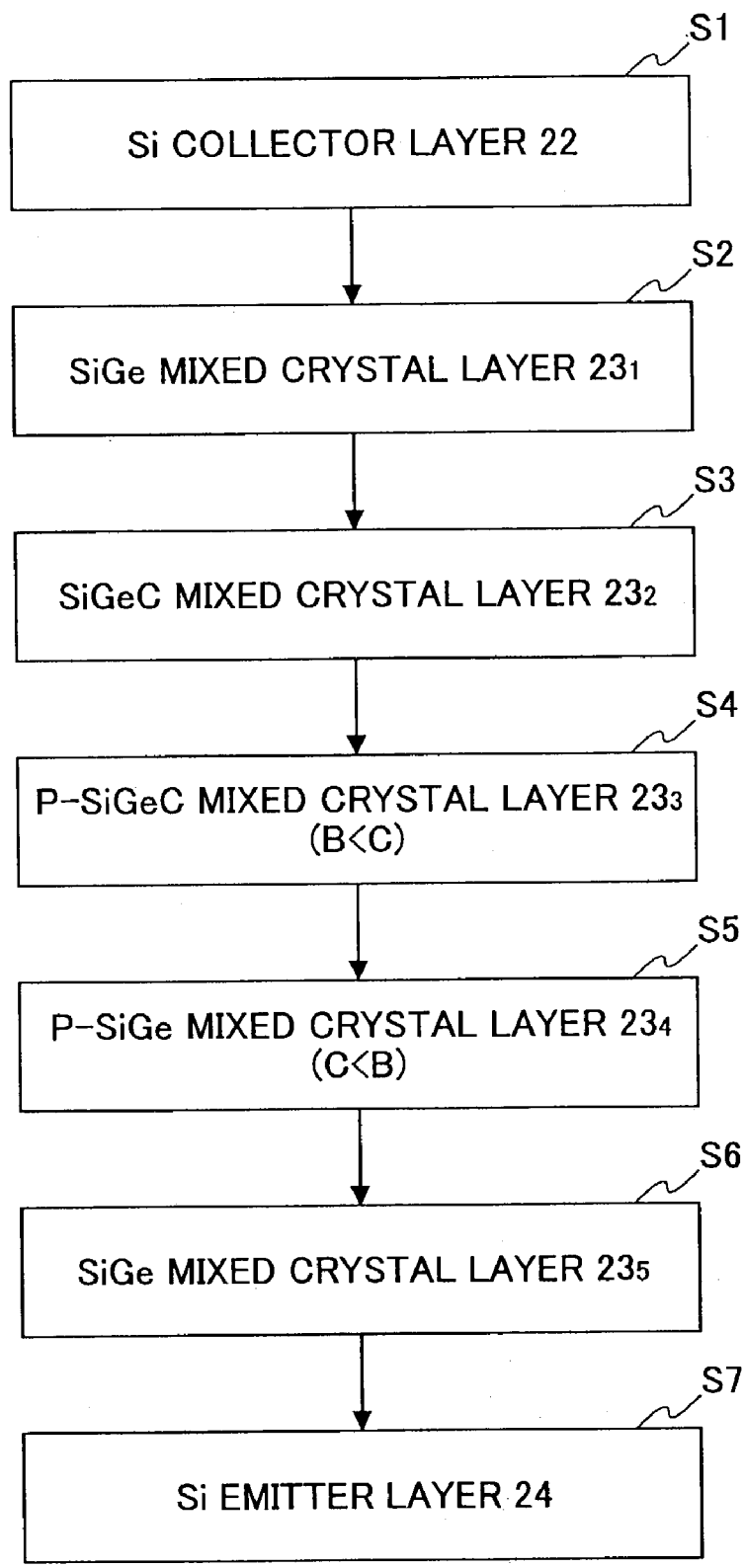
FIG. 7 is a diagram illustrating the fabrication process of the heterobipolar transistor according to the first embodiment of the present invention.
Figure 8:
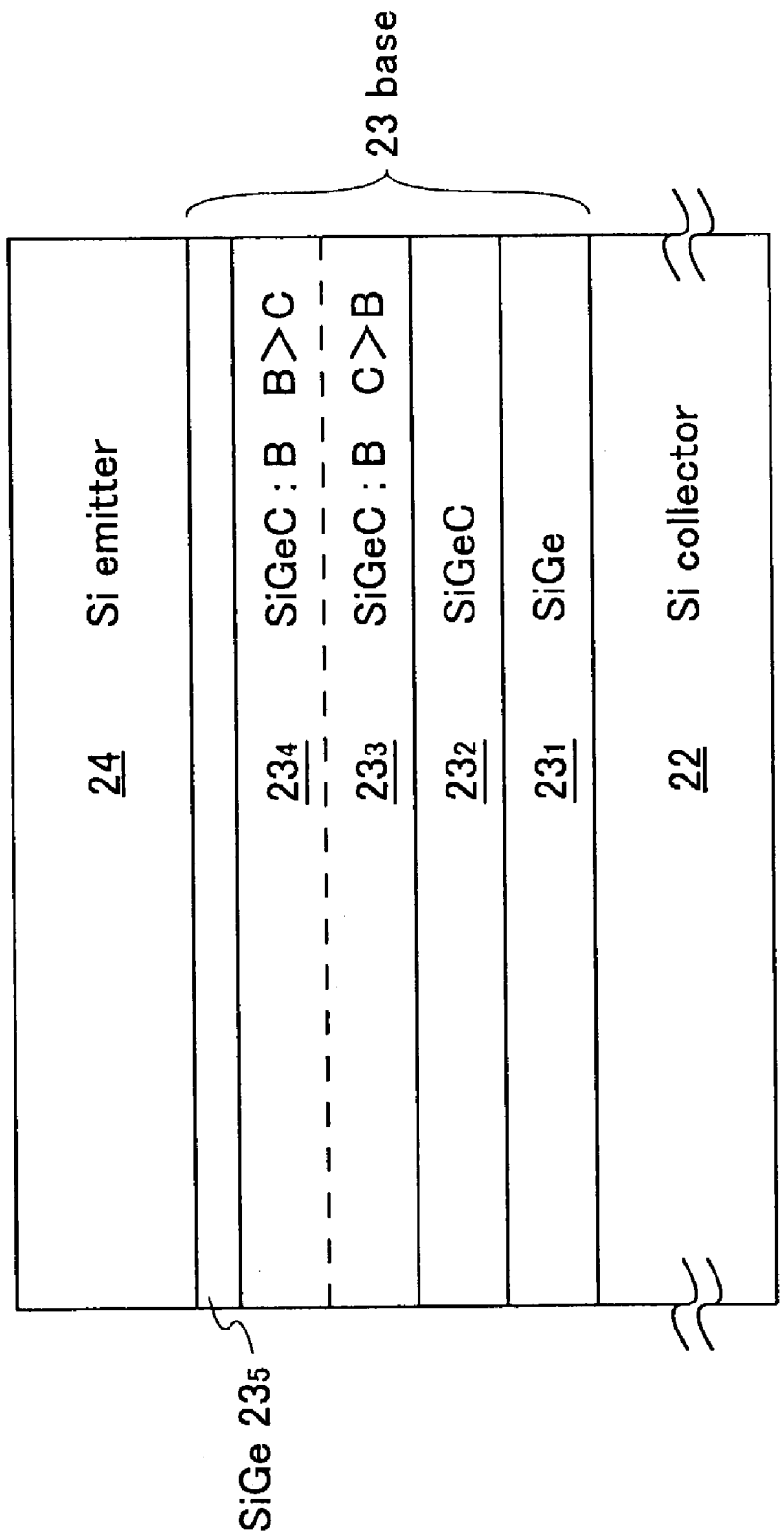
FIG. 8 is a diagram showing a portion of the layer structure of the heterobipolar transistor according to the first embodiment of the present invention.

FIGS. 5 and 6 show the results obtained from a SIMS analysis of the element distribution of a film obtained by successively depositing a base layer 23 corresponding to the base layer 13 of FIG. 1A and an emitter layer 24 corresponding to the emitter layer 14 of FIG. 1A on top of a collector layer 22 made of an n-type Si corresponding to the collector layer 12 of FIG. 1A according to procedures shown in the flowchart of FIG. 7 using the vapor deposition apparatus 100 of FIG. 4 so as to form a semiconductor laminated structure as shown in FIG. 8. It is noted that the semiconductor laminated structure of FIG. 8 made up of layers 22, 23, and 24 corresponds to the semiconductor laminated structure of FIG. 1A made up of layers 12, 13, and 14. Also, in FIG. 6, a thermal process similar to that of FIG. 3 is performed on the structure of FIG. 8.

With reference to FIGS. 7 and 8, in step S1, the collector layer 22 made of n-type Si (silicon) corresponding to the collector layer 12 of FIG. 1A is formed on a collector contact layer 21 corresponding to the $n^+$ type well 11B of FIG. 1A by injecting $SiH_4$ gas into the quartz reactor 101 via the material injection port 101a in the vapor deposition apparatus 100 of FIG. 4. Further, in step S2, a SiGe mixed crystal layer $23_1$ is formed on the collector layer 22 as a portion of the base layer 23 corresponding to the base layer 13 of FIG. 1A by injecting a mixture of $SiH_4$ gas and $GeH_4$ gas in a similar fashion. Then, in step S3, a mixture of $SiH_4$ gas, $SiH_3CH_3$ gas, and $GeH_4$ gas is injected, resulting in the deposition of a SiGeC mixed crystal layer $23_2$.

In step S4 following the step S3, a mixture of $SiH_4$ gas, $SiH_4$ gas, and $SiH_4$ gas plus $B_2H_6$ gas is injected into the quartz reactor 101, resulting in the deposition of a boron-doped p-type SiGeC mixed crystal layer $23_3$ on the SiGeC mixed crystal layer $23_2$. In this step, the gas flow ratio of the $SiH_3CH_3$ gas to the $B_2H_6$ gas is arranged so that the concentration of C (carbon) is higher than the concentration of B (boron) in the SiGeC mixed crystal layer $23_3$.

In step S5, the mixture of $SiH_4$ gas, $SiH_3CH_3$ gas, and $GeH_4$ gas with the addition of the $B_2H_6$ gas continues to be injected, and a p-type SiGeC mixed crystal layer $23_4$ is successively formed after the formation of the p-type SiGeC mixed crystal layer $23_3$; however, in this step, the gas flow ratio of the $SiH_3CH_3$ gas to the $B_2H_6$ gas is arranged so that the concentration of B (boron) is higher than the concentration of C (carbon) in the p-type SiGeC mixed crystal layer $23_4$.

Further, in step S6 following the step S5, a thin SiGe layer $23_5$ is formed on the B-doped SiGeC mixed crystal layer $23_4$.

FIG. 5 shows the distribution of Ge (germanium), C (carbon) and B (boron) in the semiconductor laminated structure obtained from completing the above fabrication process steps until S6, in the state right after the film deposition.

With reference to FIG. 5, the distribution of B (boron) is controlled by the distribution of C (carbon) particularly, in the B-doped SiGeC mixed crystal layer $23_3$, on the side towards the collector layer 22, a precipitous rise in the distribution of B (boron) corresponding to the distribution of C (carbon) can be seen. Also, in the layer $23_3$, the distribution of C (carbon) is higher than the distribution of B (boron).

On the other hand, in the mixed crystal layer $23_4$ above the mixed crystal layer $23_3$, the concentration of B (boron) is equal to or above the concentration of C (carbon). Also, it can be discerned that the C (carbon) in the SiGeC mixed crystal layer $23_4$ is dispersed into the SiGe mixed crystal layer $23_5$. However, in the state right after the completion of the formation process of the base layer 23 as shown in FIG. 5, the high concentration of B (boron) in the mixed crystal layer $23_4$ is still maintained, and the substantial dispersion of the B (boron) in the SiGe mixed crystal layer $23_5$ does yet not occur.

Further, on the base layer 23 formed in the above-described manner, an n-type emitter layer 24 is formed using the low pressure CVD apparatus of FIG. 3.

Referring back to FIGS. 7 and 8, in step S7, a phosphorous-doped Si (silicon) layer is deposited as the emitter layer 24 at a substrate temperature of 650° C., for example, on the SiGe mixed crystal layer $23_5$, which makes up the uppermost portion of the base layer 23, by injecting $SiH_4$ gas and $PH_3$ dopant gas into the quartz reactor 101 via the material injection port 101a of the vapor deposition apparatus of FIG. 4. Alternatively, the emitter 24 may be deposited in an amorphous state or as polysilicon as will be described in the following preferred embodiments. The emitter 24 can then be epitaxially re-crystallized onto the base layer 23.

Figure 11A:
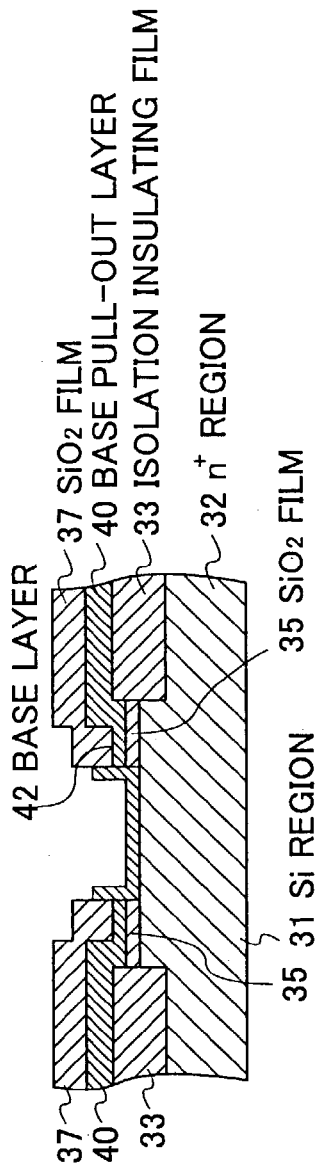
FIGS. 11A–11C are diagrams illustrating the fabrication process of the heterobipolar transistor according to the second embodiment of the present invention (part 3)
Figure 11B:
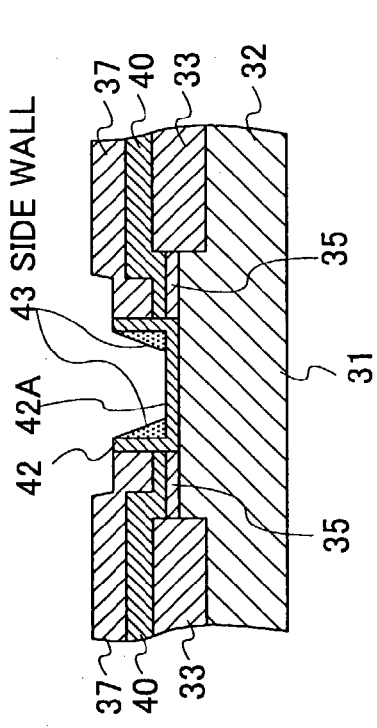

FIG. 6 shows the distribution of Ge (germanium), C (carbon), B (boron), and P (phosphorous) in the layers 22 through 24, wherein the emitter layer 24 is formed on the base layer 23 in the manner described above, and a thermal process (700–800° C.) corresponding to the formation of the CVD insulating film described in FIG. 11B with relation to the actual fabrication process of the heterobipolar transistor and a rapid thermal annealing (RTA) process at a temperature of 900–1000° C. is performed.

With reference to FIG. 6, after the formation of the emitter layer 24, the C (carbon) and B (boron) are dispersed from the base layer 23, especially the B-doped SiGeC mixed crystal layer $23_4$ where the concentration of B (boron) is higher than the concentration of C (carbon), into the emitter layer 24 at a concentration rate of over $1\times10^{18}$ cm$^{-3}$ as a result of the thermal process accompanying the CVD process for the formation of the emitter layer 24. Thus, both B (boron) and C (carbon) are contained in the P-doped emitter layer 24.

In comparing the profile of FIG. 6 with the profile of FIG. 3, it can be discerned that in the heterobipolar transistor of FIG. 3, B (boron) is hardly contained in the emitter layer 14.

On the other hand, with reference to the profile of FIG. 6, it can be discerned that B (boron) does not penetrate deeply into the emitter layer 24, and the distribution of B (boron) is limited to be close to the interface of the base layer 23 and the emitter layer 24 to a depth of 0.01–0.02 μm in the emitter layer 24.

Conventionally, in a SiGe heterobipolar transistor in which the dispersion of B (boron) occurs from the base layer to the emitter layer, the carrier concentration decreases in the interface region of the emitter layer and the base layer as a result of the co-existence of the p-type dopant and the n-type dopant, thereby increasing the emitter resistance, and also, the carrier concentration in the base layer decreases due to the dispersion of the dopants into the emitter layer. Therefore it has been expected that the electric characteristics such as the noise figure that can be obtained by formula 1 will be degraded, in turn, the dispersion of B (boron) into the emitter layer has conventionally been controlled by injecting C (carbon) into the base layer so that its concentration exceeds the concentration of B (boron) in the above base layer.

On the other hand, the noise figure obtained by formula 1 for the heterobipolar transistor formed through the above described fabrication process of the present invention in which B (boron) is dispersed in the emitter layer 24 is greatly improved to a value of 0.48–0.55 dB compared to that for the conventional heterobipolar transistor, which has a value of 0.8–1.2 dB.

The cause of this effect is not sufficiently investigated at the present moment; however, it can be estimated that the ease in the electric voltage of the base-emitter interface region with the dispersion of B (boron) into the emitter layer from the base layer contributes to this effect. Also, as shown in the SIMS profile of FIG. 6, according to the embodiment of the present invention, the SiGeC mixed crystal layer 23$_4$, which is the dispersion source of B (boron), contains C (carbon) besides B, although C has a lower concentration. As a result, C is also dispersed into the emitter layer 24 along with B, and it is possible that the dispersion of C controls the dispersion of B in the farther areas of the emitter 24 where dispersion of B cannot normally be controlled. In fact, around the interface of the emitter layer and the base layer, a concentration of C equaling or exceeding that of B can be seen.

According to this embodiment, a SiGeC type heterobipolar transistor having excellent electric characteristics can be made by controlling the dispersion of B from the p-type base layer made of a SiGeC mixed crystal layer into the emitter layer.

Also, in the present embodiment, the steps S2 and S3 in the process of FIG. 7 may be omitted. Further, the step S6 of the process of FIG. 7 may also be omitted.

Second Embodiment

Next, the configuration and fabrication method of an npn-type heterobipolar transistor according to a second embodiment of the present invention is described.

FIGS. 9A–9C, 10A–10C, and 11A–11C show the fabrication process of the heterobipolar transistor according to the second embodiment.

Figure 9A:
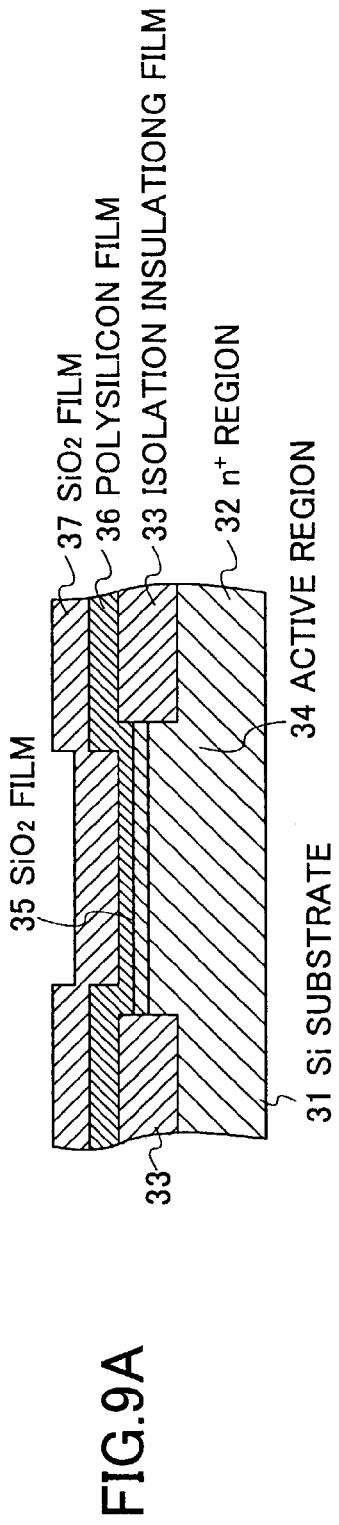
FIGS. 9A–9C are diagrams illustrating the fabrication process of the heterobipolar transistor according to the second embodiment of the present invention (part 1)

With reference to FIG. 9A, an n-type impurity, for example, P (phosphorous) at a dose of $1\times10^{14}$ cm$^{-2}$ and at acceleration energy 300 keV is ion-implanted to the surface of a p-type Si (silicon) substrate 31 to form a n$^+$ dispersion region 32. This n$^+$ dispersion region 32 functions as the collector of the heterobipolar transistor.

Subsequently, an isolation insulating film 33 is formed on an isolation region of the Si substrate 31 using the LOCOS technique and the like. Then, a SiO$_2$ film 35 is formed on the exposed surface of the substrate 31 at a film thickness of 30–100 nm using the CVD technique, and after forming a polysilicon film 36 onto this surface and the insulating film 33 using the CVD technique, a SiO2 film 37 is formed at a film thickness of 300–700 nm also using the CVD technique.

Figure 9B:
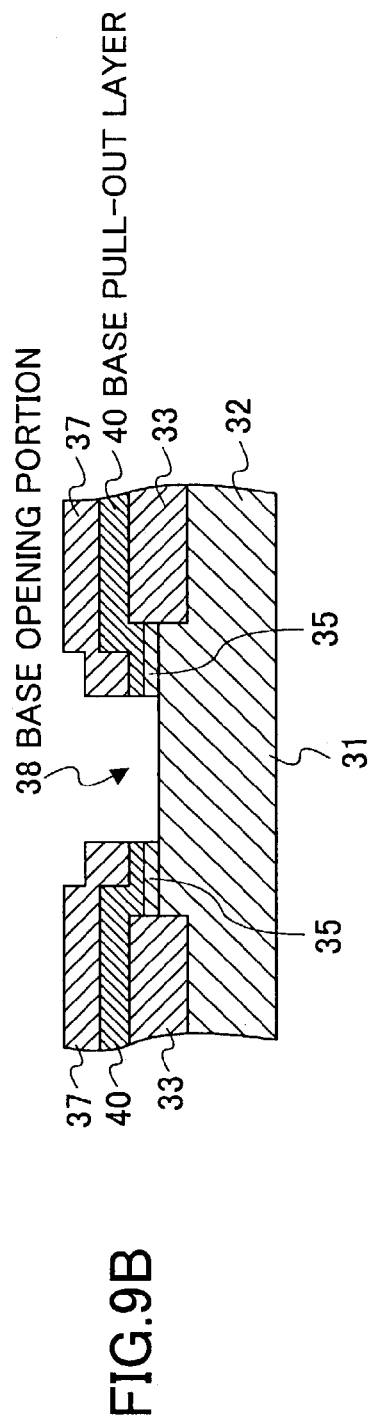

Next, in the process of FIG. 9B, in the multi-layered structure made of the SiO$_2$ film 35, the polysilicon film 36, and the SiO2 film 37, a region for forming the base of the heterobipolar transistor is patterned, and a base opening portion 38 exposing a portion of the surface of the n$^+$ dispersion region 32 is formed. Here, the polysilicon film 36 forms a base pull-out layer 40.

Figure 9C:
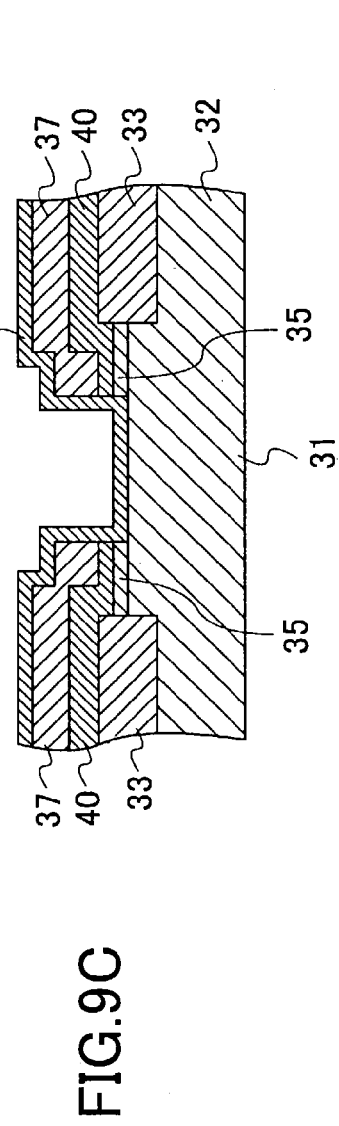

Next, in the process of FIG. 9C, a SiGe/SiGeC film 39 covering the inner walls of the base opening portion 38 and the SiO2 film 37 is formed on the n$^+$ dispersion region 32 at a film thickness of approximately 80 nm, by the low pressure epitaxial growth technique using the vapor deposition apparatus as shown in FIG. 4. The above SiGe/SiGeC film 39 is a film having a SiGeC film successively deposited on a SiGe film.

In the present embodiment, B (boron) is used as the p-type impurity for the doping process in forming the SiGeC film. Here the film deposition conditions are adjusted so that the concentration of C (carbon) in the base layer is higher than the concentration of B at a first interface facing the collector layer (n$^+$ dispersion region) 32, and so that the concentration of B is higher than the concentration of C at a second interface facing the emitter layer, which is to be formed in the next step. As a result, the distribution of B and C as described in FIG. 5 can be obtained within the SiGe/SiGeC film 39 as well.

Also, the bottom portion of the SiGe/SiGeC film 39 covering the surface of the n$^+$ dispersion region 32, exposed upon the formation of the base opening portion 38 and functioning as the collector, crystallizes into a single crystalline state. The other portions of the SiGe/SiGeC film 39 (including side wall portions of the SiGe/SiGeC film 39 to be formed in the subsequent steps) are crystallized into a polycrystalline state.

Next, in the step of FIG. 10A, a resist film 41 is applied, filling in the base opening portion 38. Then in the process of FIG. 10B, anisotropic etching is performed so that the photo resist 41 is etched in a perpendicular direction with respect to the film, leaving behind a resist pattern 41A, which is at a predetermined depth in the base opening portion 38.

Next, in the step of FIG. 10C, anisotropic dry etching is performed on the SiGe/SiGeC film 39 using the resist pattern 41A as a mask so that the SiGe/SiGeC film 39 remains only in the base opening portion 38 at the predetermined depth corresponding to the depth of the resist pattern 41A.

Next, in the step of FIG. 11A, a base layer 42, including the flat bottom portion made of a single crystal and side walls extending perpendicular to the bottom portion made of polysilicon, is formed by removing the resist pattern 41A through an etching (ashing) process or the like. The base layer 42 is electrically connected to the base pull-out layer 40 at its side wall portions.

Next, as shown in FIG. 11B, by depositing a silicon oxide film at a temperature of 700–800° C. using the CVD technique and performing an etch back process, a side wall insulating film 43 exposing a center portion 42A of the base layer 42 and covering the side wall portions of the base layer 42 and the inner wall surface of the silicon oxide film 37 is formed. This side wall insulating film 43 has a tapered surface wall surrounding the center portion 42A of the base layer 42.

Figure 11C:
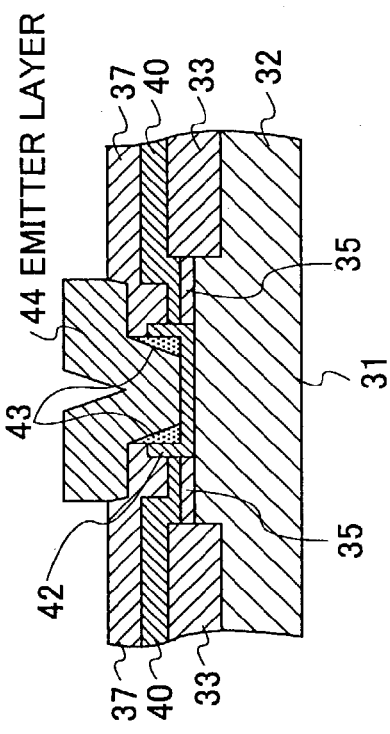
Figure 12:
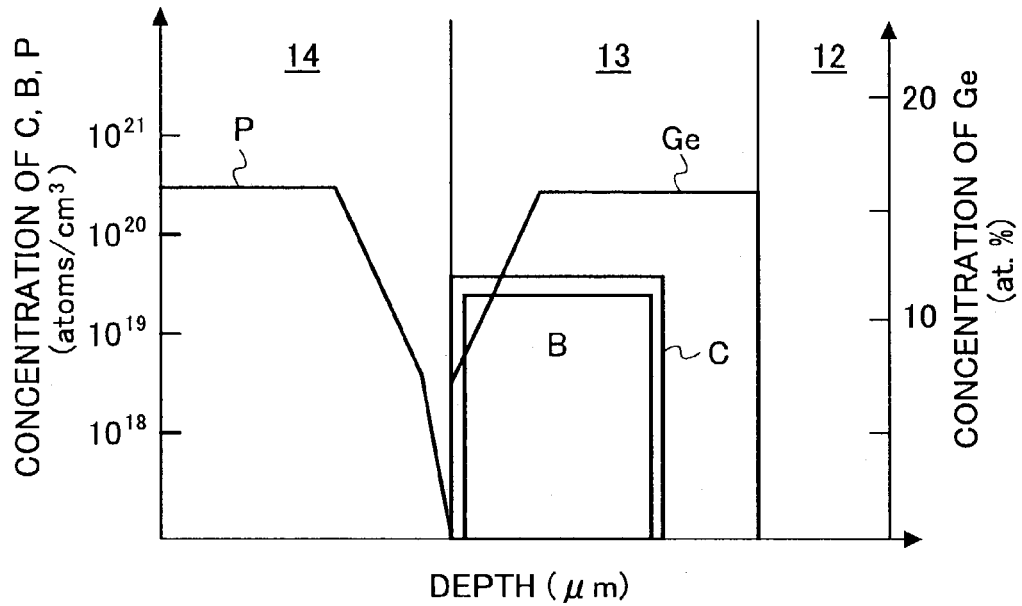
FIG. 12 is another diagram showing the element distribution in the films upon creating the conventional heterobipolar transistor according to the FIG. 1.

Further, as shown in FIG. 11C, an n-type polysilicon film or an amorphous silicon film is deposited using the CVD technique, wherein a photolithography process followed by a dry etching process is performed and an emitter layer 44 connecting to the base layer 42 at the base layer center portion 42A is formed. In this process, due to the heat generated upon the deposition of the n-type polysilicon film or the amorphous silicon film, and also due to the subsequent thermal process, a portion of the n-type impurity is dispersed into the SiGeC mixed crystal layer making up the base layer 42, thereby making a slight connection.

After going through the above thermal process, an impurity element distribution profile similar to that described in FIG. 6 can be obtained in the base layer 42 as well.

Subsequently, an inter-layer insulating film, a wiring layer and the like are formed, thus completing the fabrication of the heterobipolar transistor according to the second embodiment.

As previously mentioned, in the heterobipolar transistor formed in the above-described manner, a controlled dispersion of B from the base layer 42 to the emitter layer 44 can be realized, and as a result, the transistor characteristics such as the operating speed, the frequency characteristics, and/or the noise margin can be improved.

Third Embodiment

In the following, the structure and fabrication method of a heterobipolar transistor according to a third embodiment of the present invention are described with reference to FIGS. 13 through 20.

Figure 13:
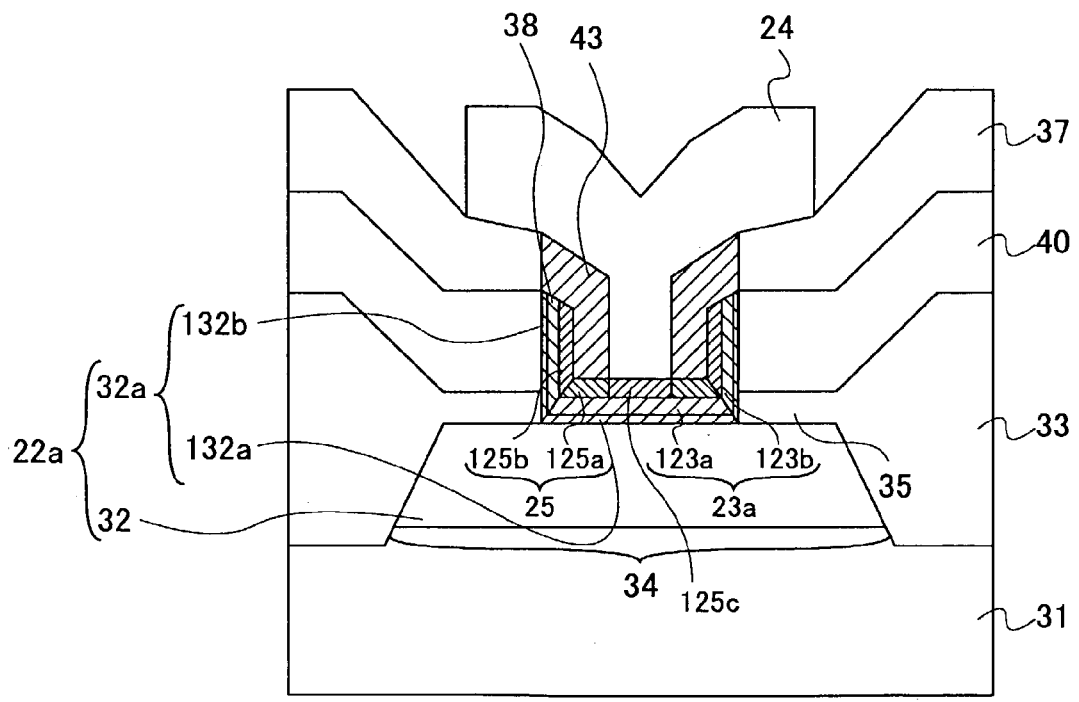
FIG. 13 is a cross sectional view of the heterobipolar transistor according to the third embodiment of the present invention.

FIG. 13 is a cross sectional view of the heterobipolar transistor according to the above embodiment. Features/components of the configuration and fabrication method of the heterobipolar transistor of this embodiment that are identical to those of the first and second embodiment described in FIGS. 1 through 12 are given the same numerical references and their descriptions are either simplified or omitted.

With reference to FIG. 13, the structure of the heterobipolar transistor according to the present embodiment is described in the following.

As shown, on the p-type Si substrate 31, the $n^+$ well, namely, the $n^+$ type dispersion region 32 is formed. The $n^+$ type dispersion region 32 constitutes a part of a collector layer 22a.

In the isolation region of the Si substrate 31, the isolation insulating layer 33 is formed. An active region 34 is determined by the isolation insulating layer 33.

On the Si substrate 31 forming the active region 34, the $SiO_2$ film 35 is formed.

On the $SiO_2$ film 35 and the isolation insulating film 33, the pull-out base layer 40 made of a polysilicon film is formed.

On the pull-out base layer 40, the $SiO_2$ film 37 is formed.

The opening portion 38 reaching down to the collector layer 22a is formed by the $SiO_2$ film 37, the base pull-out layer 40, and the $SiO_2$ film 35.

On the $n^+$ type dispersion region 32 within the opening portion 38, a Si layer 32a is formed. A portion 132a of the Si layer 32a, formed on the Si substrate 31, more specifically, on the $n^+$ type dispersion region 32, is epitaxially grown and is in a single crystalline state. A portion 132b of the Si layer 32a, formed by the sides of the pull-out base layer 40 and the sides of the $SiO_2$ film 35 is in a polycrystalline state. The Si layer 32a contains dopant impurities of the n-type dispersed from the $n^+$ type dispersion region 32. The Si layer 32a makes up a part of the collector layer 22a. Thus, the collector layer 22a is made of the $n^+$ type dispersion region 32 and the Si layer 32a. The Si layer 32a is formed in this embodiment in order to obtain a clean layer that contains very little oxygen.

On the Si layer 32a in the opening portion 38, a base layer 23a made of SiGe/SiGeC is formed. A portion 123a of the base layer 23a, formed on the single crystalline portion 132a of the Si layer 32a, is in a single crystalline state. On the other hand, a portion 123b of the base layer 23a, formed on the polycrystalline portion 132b of the Si layer 32a, is in a polycrystalline state.

Figure 14:
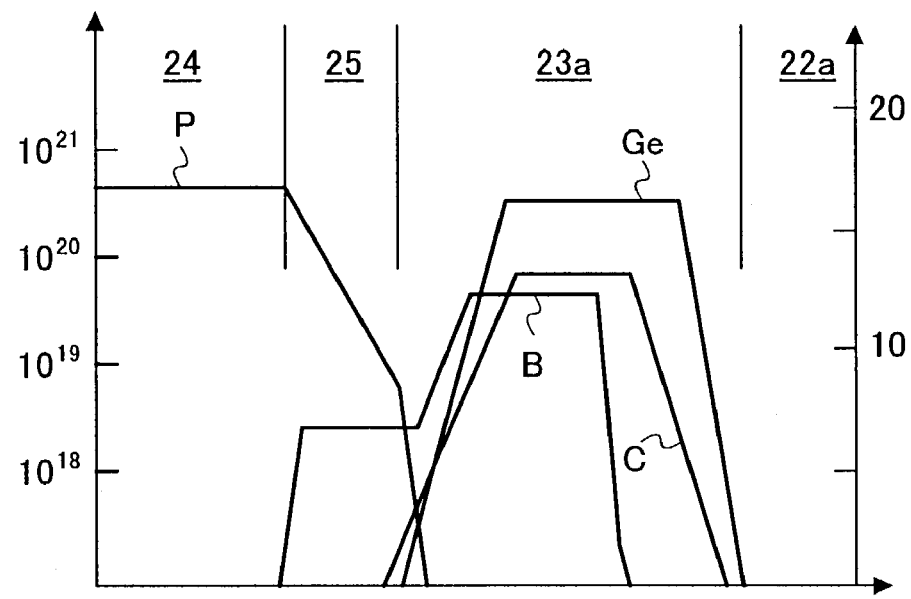
FIG. 14 is a diagram illustrating the element distribution in the films of the heterobipolar transistor according to the third embodiment of the present invention.

FIG. 14 shows the element distribution in the films of the heterobipolar transistor according to the present embodiment.

As shown in FIG. 14, in the region containing the boundary between the collector layer 22a and the base layer 23a, namely, the region containing the interface of the collector layer 22a side of the base layer 23a, a Ge concentration gradient can be seen, the concentration of Ge gradually increasing in a direction from the collector layer 22a to the emitter layer 24. It is noted that the concentration gradient of Ge is a linear line. The thickness of the region in which the Ge concentration gradient exists can be, for example, 16 nm, and within this region, the concentration of Ge varies from 0% at the collector layer 22a side to 16% at the emitter layer 24 side.

In the above example, the region in which the Ge concentration gradient exists has a thickness of 16 nm; however, the thickness of this region is not limited to being 16 nm. Rather, the region having a Ge concentration gradient can be thinner than 16 nm, for example.

The Ge concentration gradient in the base layer 23a towards the interface of the collector layer 22a exists essentially in order to prevent the occurrence of a misfit dislocation around the interface of the collector layer 22a and the base layer 23a. In the base layer 23a, germanium (Ge) is contained at a high concentration, and the thicker the region having a high concentration of Ge gets, the more likely it is for the base layer 23a, grown while accumulating the distortions, to generate misfit dislocations around the interface region of the collector layer 22a and the base layer 23a through thermal processing of a later process, and to cause lattice relaxation. This in turn generates a significant amount of leak currents in between the base and the collector layers and in between the base and the emitter layers, thereby preventing the realization of desirable electric characteristics. Thus, in the present embodiment, a Ge concentration gradient in which the Ge concentration gradually increases in the direction towards the emitter layer 24a from the collector layer 22a is formed in the region including the interface on the collector 22a side of the base layer 23a so as to prevent the misfit dislocation from occurring.

If the Ge concentration gradient is not formed in the region including the interface on the collector layer 22a side of the base layer 23a, this will result, for example, in the generation of a misfit dislocation of over $1 \times 10^6/cm^2$ from the thermal hysteresis after the growth of the base layer 23a.

In contrast, upon forming the Ge concentration gradient in the region including the interface on the collector layer 22a side of the base layer 23a, specifically, upon providing a Ge concentration gradient within a region including the interface on the collector layer 22 side of the base layer 23a and 16 nm therefrom, the misfit dislocation does not occur. Thus, according to the present invention, the misfit dislocation can be prevented and the leak current can be controlled.

However, when the region having the Ge concentration gradient is made too thick, the high speed characteristics, namely, the cut-off frequency $f_T$ and the like will be degraded. Therefore, the thickness of the region having the Ge concentration gradient should be set to a suitable value for each heterobipolar transistor so that the high speed characteristics will not be degraded. As a general criterion, the distance between a region in the base layer 23a that has a concentration of B above $1 \times 10^{19}$ cm$^{-3}$ and the region in the base layer 23a that has a Ge concentration gradient should preferably be below 15 nm in order to prevent the degradation of the high speed characteristics and also, to protect the NF characteristics and DC characteristics from unfavourable influences.

In the region of the base layer 23a that includes the interface on the emitter layer 24 side, namely, the region in the base layer 23a that includes the interface of the base layer 23a and a cap layer 25 (to be described later), a Ge concentration gradient that gradually decreases in the direction from the collector 22a side to the emitter layer 24 side is formed. The above Ge concentration gradient is a linear line and the thickness of the region having the Ge concentration gradient is, for example, 30–35 nm. Also, the Ge concentration in the region having the Ge concentration gradient may be at 16% on the collector layer 22a side and 0% on the emitter layer 24 side, for example.

The Ge concentration gradient in the region of the base layer 23a including the interface on the emitter layer 24 side indicating a decrease in the Ge concentration at the emitter-base junction is provided in order to increase the breakdown voltage between the emitter-collector layers. Also, the Ge concentration gradient is arranged to be linear in order to keep the drift electric field applied to the electrons constant and to thereby realize high speed characteristics in the heterobipolar transistor.

In the above example, the Ge concentration gradient is arranged into a linear line, but this does not necessarily have to be the case. As long as the germanium (Ge) concentration in the base layer 23a decreases in the region of the base layer 23a including the interface on the emitter layer 24 side, the breakdown voltage between the emitter-collector layers can be increased. However, optimum high speed characteristics can be realized by making the germanium (Ge) concentration gradient linear since the band gap can be successively changed and the drift electric field applied to the electrons can be kept constant.

Also, in this embodiment, the Ge concentration in the region having the Ge concentration gradient is set to 0% on the emitter 24 side; however, the Ge concentration on the emitter layer side does not necessarily have to be 0%. That is, as long as the Ge concentration in the base layer 23a decreases in the region including the interface on the emitter layer 24 side, the breakdown voltage between the emitter-collector layers can be increased.

For example, if the Ge concentration, in the region having the Ge concentration gradient, is set to 5% or below on the emitter layer 24 side, the breakdown voltage between the emitter-collector layers can be raised to a certain degree. Alternatively, if the Ge concentration, in the region having the Ge concentration gradient, is set to 1% or below on the emitter layer 24 side, the breakdown voltage between the emitter-collector layers can be further increased. Moreover, if the Ge concentration, in the region having the Ge concentration gradient, is substantially set to 0% on the emitter layer 24 side, the breakdown voltage between the emitter-collector layers can be raised even further. Herein, the expression 'substantially 0%' refers to a state in which Ge is not contained as a main constituent. It is extremely difficult to actually realize an absolute 0% Ge concentration, and in practice, an insignificant amount of Ge is still contained, thereby expressing such a state as 'substantially 0%'.

On the base layer 23a, the cap layer 25 made of Si doped with B is formed. The cap layer 25 is formed in order to protect the surface of the Si/SiGe/SiGeC film 39a (see FIG. 19C) after the growth of the Si/SiGe/SiGeC film 39a. Also, the cap layer 25 controls the concentration of the dopant impurity in the pn junction occurring between the base layer 23a and the emitter layer 24 so that the breakdown voltage between the emitter-base layers will not be lowered. The cap layer 25 is quite thin and may have a thickness of 30 nm, for example. A portion 125a of the cap layer 25, which is formed on the single crystalline base layer 123a, is a single crystal. A portion 125b of the cap layer 25, which is formed on the polycrystalline base layer 123b, is a polycrystal. Also, in a portion 125c of the cap layer 25 situated directly below the emitter layer 24, a high concentration of the n-type dopant impurity, thermally dispersed from the emitter, is contained. Thus, in the portion 125c of the cap layer 25, situated directly below the emitter layer 24, the concentration of the n-type dopant impurity is higher than the concentration of B.

In the description of the first and second embodiments, the description of the cap layer has been omitted; however, in this embodiment, the description of the cap layer is given.

In this embodiment, the cap layer 25 forms a thin layer having a thickness of 30 nm. In this way, the noise figure (NF) and the high speed performance of the heterobipolar transistor can be improved. However, merely making the cap layer 25 thinner will cause the breakdown voltage between the emitter-collector layers to be lowered. Accordingly, it has been discovered by the inventors of the present invention that by providing a Ge concentration gradient, in which the Ge concentration gradually decreases in the direction from the collector layer 22a side to the emitter layer 24 side, in the region of the base layer 23a including the interface on the emitter layer 24 side, the breakdown voltage between the emitter-collector layers can be increased. For example, in the heterobipolar transistor shown in FIG. 1, the breakdown voltage between the emitter-collector layers is in the order of 2.4V; however, by forming a Ge concentration gradient, in which the Ge concentration gradually decreases in the direction from the base layer 13 to the emitter layer 14, in a region of the base layer 13 including the interface on the emitter layer 14 side, the breakdown voltage between the emitter-collector layers can be raised to 2.9V. The emitter-collector breakdown voltage is measured as the voltage between the emitter and the collector at which the collector current $I_c$ reaches 100 µA or above. In the present embodiment, a Ge concentration gradient exists in the region of the base layer 23a including the border with the emitter layer 24. Thus, the breakdown voltage between the emitter-collector layers can be maintained at a high level while the noise figure and the high speed performance are also improved. Thereby, according to this embodiment, the breakdown voltage between the emitter-collector layers can be maintained at a high level of 2.7V even when the cap layer 25 is formed into a thin layer having a thickness of 30 nm, for example.

Figure 15:
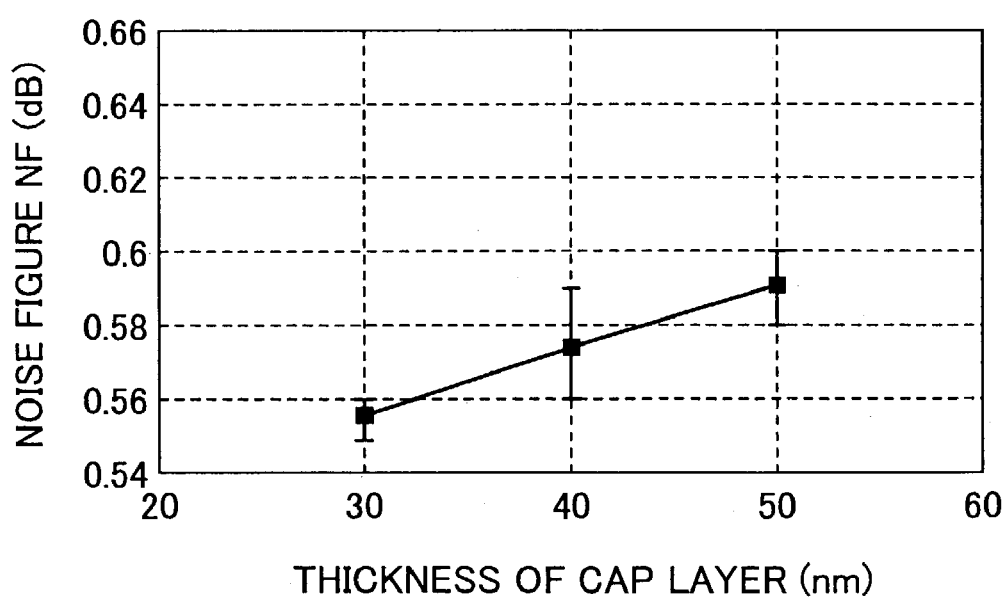
FIG. 15 is a graph indicating the relationship between the thickness of the cap layer and the noise figure.
Figure 16:
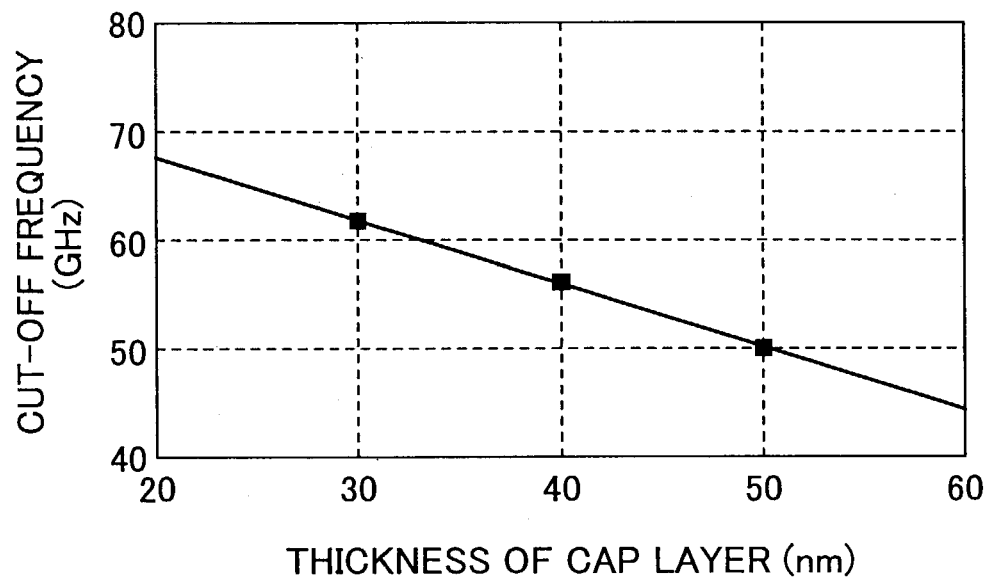
FIG. 16 is a graph indicating the relationship between the thickness of the cap layer and the cut-off frequency.
Figure 17:
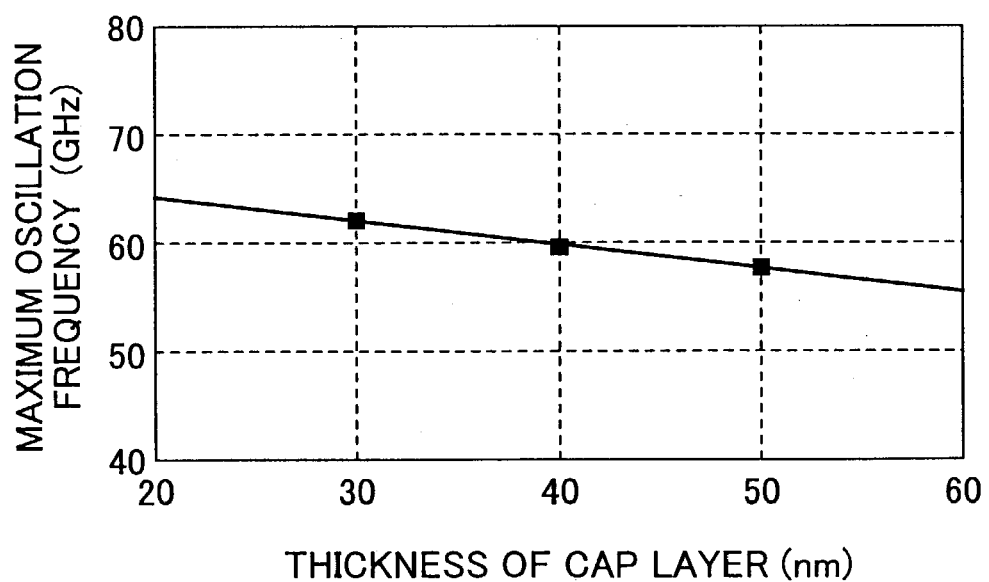
FIG. 17 is a graph indicating the relationship between the thickness of the cap layer and the maximum oscillation frequency.

FIG. 15 is a graph showing the relationship between the thickness of the cap layer and the noise figure, wherein the horizontal axis indicates the thickness of the cap layer and the vertical axis indicates the noise figure (NF). FIG. 16 is a graph showing the relationship between the thickness of the cap layer and the cut-off frequency, wherein the horizontal axis indicates the thickness of the cap layer, and the vertical axis indicates the cut-off frequency $f_T$. FIG. 17 is a graph showing the relationship between the thickness of the cap layer and the maximum oscillation frequency, wherein the horizontal axis indicates the thickness of the cap layer and the vertical axis indicates the maximum oscillation frequency $f_{max}$.

As previously mentioned, the noise frequency in the conventional heterobipolar transistor is 0.8–1.2 dB.

On the other hand, the noise frequency in the heterobipolar transistor according to the present embodiment is 0.6 dB or below when the cap layer 25 has a thickness of 50 nm, as shown in FIG. 15. Further, when the cap layer has a thickness of 30 nm, the noise figure is 0.56 dB or below. The noise characteristics of the above heterobipolar transistor can be improved by making the cap layer thinner due to an increase in the emitter ground current gain $h_{FE}$.

Thus, in the present embodiment, the noise figure can be significantly improved compared to the conventional heterobipolar transistor.

Also, as shown in FIGS. 16 and 17, the cut-off frequency and the maximum oscillation frequency can also be improved by decreasing the thickness of the cap layer 25.

In this way, the thickness of the cap layer 25 can be decreased while maintaining a high breakdown voltage between the emitter-collector layers. Thus, in the present embodiment, the noise figure, the cut-off frequency, and the maximum oscillation frequency can be improved while maintaining a high breakdown voltage between the emitter-collector layers.

Also, in the present embodiment, the concentration of B in the base layer 23a is set to $6\times10^{19}$ cm$^{-3}$, and the concentration of C in a portion of the base layer 23a which is on the collector layer 22a side is set to $8\times^{19}$ cm$^{-3}$.

The concentration of C and the concentration of B in the base layer 23a are set to the above levels so that the thermal dispersion of B to the collector layer 22a side can be controlled and the concentration of B in the base layer 23a can be raised. That is, in order to improve the noise frequency of the heterobipolar transistor, not only does B need to be dispersed into the emitter layer 24 side, but also, the concentration of B within the base layer 23a itself must be set to a high level. However, if the concentration of B is simply set to a higher level, the B in the base layer 23a will be dispersed into the collector layer 22a side due to the heat applied in the subsequent process steps where the base layer 23a is grown, thereby resulting in the degradation of the electric characteristics in the heterobipolar transistor. Thus, in the present embodiment, attempts are made to optimize the concentration of C and the concentration of B by considering their balance so that the concentration of B in the base layer 23a can be set to a high level while at the same time, the dispersion of B into the collector layer 22a side is controlled.

In the above description of the present embodiment, the concentration of C in the portion of the base layer 23a on the collector layer 22a side is set to $8\times10^{19}$ cm$^{-3}$ and the concentration of B in the base layer 23a is set to $6\times10^{19}$ cm$^{-3}$; however, the concentration of C and the concentration of B within the base layer 23a are not limited to the above values. That is, the concentration of C in the base layer 23a can be set to any level so long as the dispersion of B into the collector layer 22a side can be controlled. For example, when the concentration of B is set to be within the range of $2\times10^{19}$ cm$^{-3}$–$8\times10^{19}$ cm$^{-3}$ in the base layer 23a on the collector layer side, and the concentration of C is set to be within the range of $7\times10^{19}$ cm$^{-3}$–$9\times10^{19}$ cm$^{-3}$ at least in the portion of the base layer 23a that is on the collector layer 22a side, the concentration of B can be set to a high level in the base layer 23a while preventing the dispersion of B into the collector layer 22a side as well.

Figure 18:
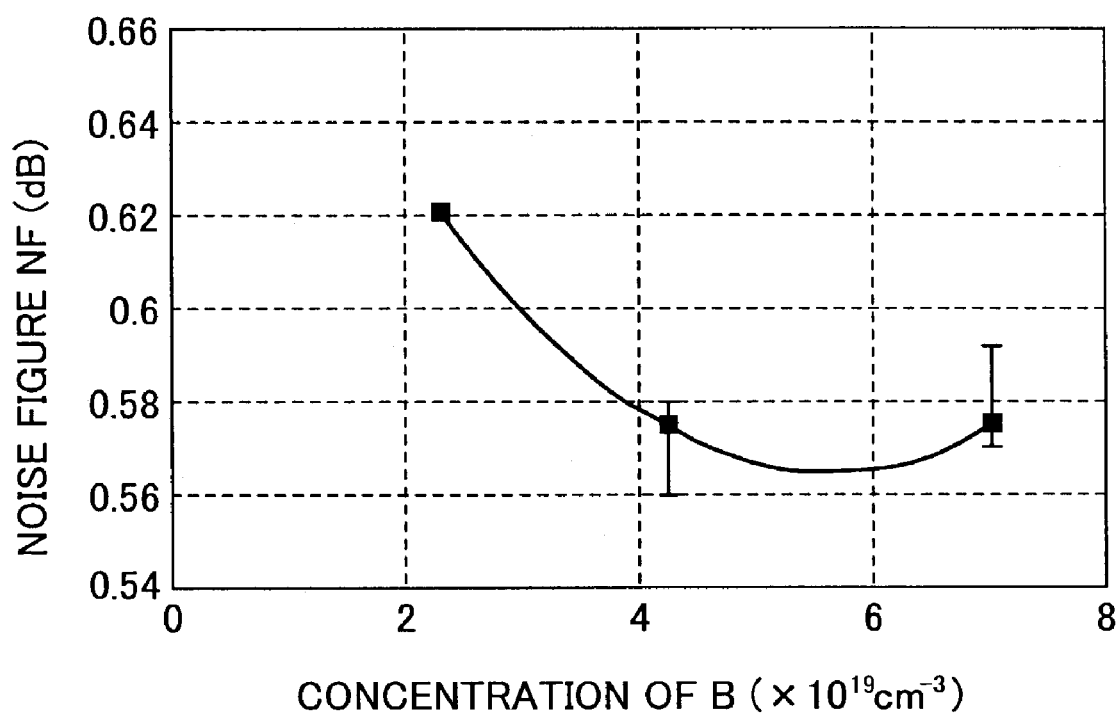
FIG. 18 is a graph showing the relationship between the concentration of B in the base layer and the noise characteristics.

FIG. 18 is a graph showing the relationship between the concentration of B in the base layer and the noise figure characteristics of the heterobipolar transistor.

As shown in FIG. 18, the noise figure tends to go down as the concentration of B in the base layer 23a is made higher.

According to the present embodiment, the noise figure can be improved without causing a degradation in the electric characteristics of the heterobipolar transistor since the concentration of B in the base layer 23a can be set to a high level while preventing the dispersion of B into the collector layer 22a side at the same time.

On the cap layer 25, the emitter layer 24 is formed.

Thus, the heterobipolar transistor according to the third embodiment of the present invention is structured in the above manner.

Accordingly, in the present embodiment, since a Ge concentration gradient, in which the concentration of Ge gradually increases in the direction from the collector layer 22a side to the emitter layer 24 side, exists in the region of the base layer 23a that includes the interface on the emitter layer 24 side, the breakdown voltage between the emitter-collector layers as well as the high speed characteristics of the heterobipolar transistor can be improved.

Also, according to the present embodiment, the thickness of the cap layer can be decreased while maintaining a high breakdown voltage between the emitter-collector layers; therefore, the noise figure and the high speed performance can be improved even further.

Additionally, according to the present embodiment, the concentration of B and the concentration of C in the base layer 23a are optimally controlled so that the concentration of B in the base layer 23a can be set to a high level while preventing the dispersion of B into the collector layer 22a side. Thus, in the present embodiment, the noise figure of the heterobipolar transistor can be improved without causing a degradation in its electric characteristics.

It is noted that in Japanese Patent Laid-Open No.2002-158232, technology for improving then value of the base current by decreasing the concentration of C on the emitter layer side is disclosed. According to the above document, the concentration of C in the base layer is less than 0.8% on the collector layer side, and 0.01% or above on the emitter layer side. Also, according to the above document, the concentration of B is lower than the concentration of C in both of the above positions within the base layer. The concentration of C in the base layer is decreased on the emitter layer side in the embodiments of the present invention as well. However, the present invention differs from the invention according to the above document in that the concentration of B is higher than the concentration of C on the emitter layer side of the base layer. In the present invention, the concentration of B in the base layer towards the emitter layer side is set to a high level in order that B is dispersed into the emitter layer side and the noise figure and the like are improved through reducing the base resistance. Another important feature of the present invention is that a Ge concentration gradient, in which the Ge concentration gradually increases in a direction from the collector layer side to the emitter layer side, exists in a region of the base layer that is on the collector layer side. In the above-mentioned patent document, absolutely no reference is made concerning this feature. Also, in the present invention, a Ge concentration gradient, in which the Ge concentration gradually decreases in a direction from the collector layer side to the emitter layer side, exists in a region of the base layer that is on the emitter layer side. This feature is not disclosed in the above-mentioned patent document either.

Further, in Japanese Patent Laid-Open No.2001-319936, technology for reducing the base resistance by doping B into a Si cap layer is disclosed. The invention according to this patent document differs from the present invention in that C is not contained in the base layer and the concentration of B in the base layer is lower at around $1 \times 10^{18}$ cm$^{-3}$. As previously mentioned, in the present invention, the concentration of B is set at a high level, without B being dispersed into the emitter layer side, so as to improve the noise figure and the like of the heterobipolar transistor by reducing the base resistance. Also, as previously mentioned, in the present invention, C is contained in the base layer in order to prevent the dispersion of B into the emitter layer, which in turn prevents the degradation of the electric characteristics, and in order to prevent the misfit dislocation from occurring, which in turn prevents an increase in the leak current. Thus, as described above, the present invention differs greatly from the invention disclosed in the above patent document.

In the following, a fabrication method of the heterobipolar transistor according to the third embodiment of the present invention is described with reference to FIGS. 19 and 20. FIGS. 19A–19C are cross sectional views of the process steps indicating the fabrication method of the heterobipolar transistor according to the present embodiment. FIG. 20 is a diagram showing a portion of the layer structure of the heterobipolar transistor according to the present embodiment.

Figure 19A:
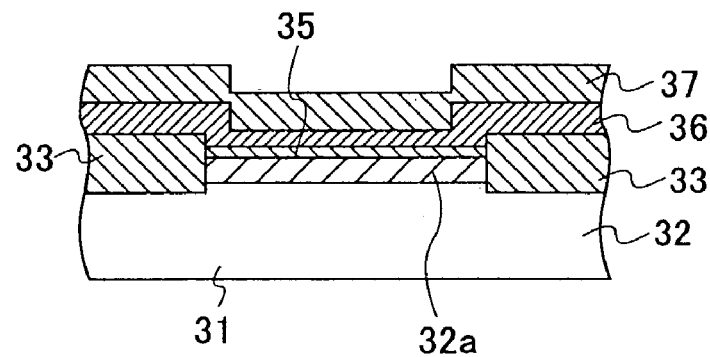
FIGS. 19A–19C are cross sectional views showing the fabrication process of the heterobipolar transistor according to the third embodiment of the present invention.
Figure 20:
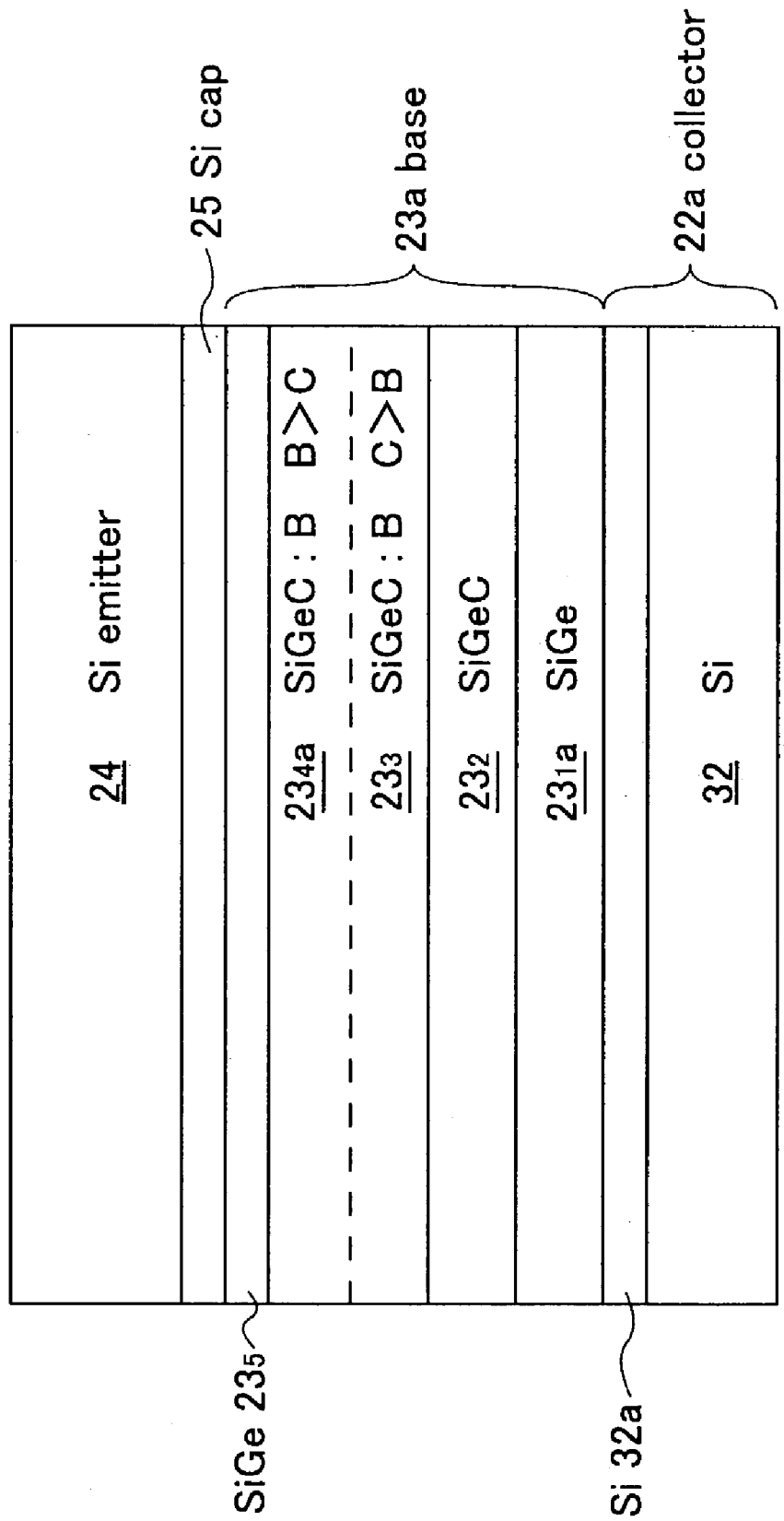
FIG. 20 is a diagram showing a portion of the layer structure of the heterobipolar transistor according to the third embodiment of the present invention.

First, as shown in FIG. 19A, an n-type dopant impurity is injected into a p-type Si substrate 31 by using the ion-implantation technique. The n-type impurity may be, for example, P. The ion-implantation conditions may be, for example, at a dose of $1 \times 10^{14}$/cm$^{-2}$ and at speed energy 300 keV. In this way, the n$^+$ dispersion region 32 having a thickness of approximately 0.5 μm, for example, may be formed. This n$^+$ dispersion region 32 constitutes a part of the collector layer 22a as previously mentioned.

Figure 19B:
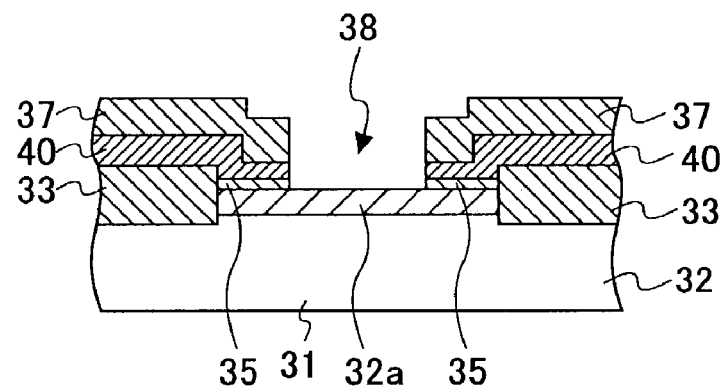

The fabrication method of the heterobipolar transistor according to the present embodiment shown in FIGS. 19A and 19B is identical to the fabrication method previously described with reference to FIGS. 9A and 9B; therefore, the description thereof is omitted.

Figure 19C:
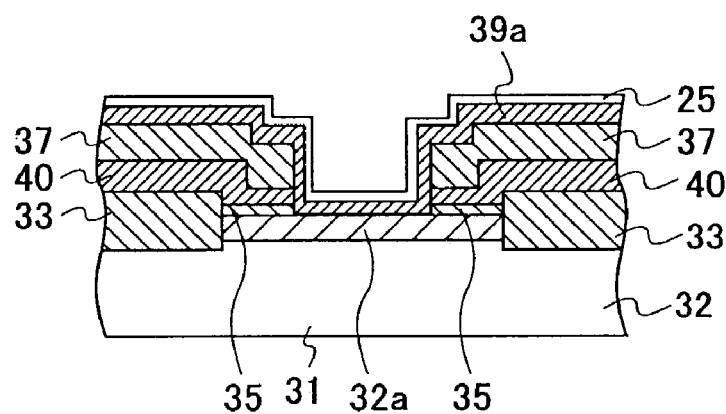

Next, as shown in FIG. 19C, a Si/SiGe/SiGeC film 39a is formed onto the entire upper surface using the low-pressure epitaxial growth technique.

The Si layer of the Si/SiGe/SiGeC film 39a corresponds to the Si layer 32a shown in FIGS. 13 and 20. This Si layer 32a, together with the n$^+$ dispersion region 32, makes up the collector layer 22a. The Si layer 32a may have a thickness of approximately 16 nm, for example.

The SiGe/SiGeC layer of the Si/SiGe/SiGeC film 39a corresponds to the SiGe mixed crystal layer $23_{1a}$, the SiGeC mixed crystal layer $23_2$, the SiGeC mixed crystal layer $23_3$, the SiGeC mixed crystal layer $23_{4a}$, and the SiGe mixed crystal layer $23_5$ shown in FIG. 20. Namely, the SiGe/SiGeC layer of the Si/SiGe/SiGeC film 39a constitutes the base layer 23a. The base layer 23a made up of the SiGe/SiGeC layer is formed by successively laminating the SiGe mixed crystal layer $23_{1a}$, the SiGeC mixed crystal layer $23_2$, the SiGeC mixed crystal layer $23_3$, the SiGeC mixed crystal layer $23_{4a}$, and the SiGe mixed crystal layer $23_5$ in this order as shown in FIG. 20. The total film thickness of the base layer 23a may be in the order of 80 nm, for example.

Upon forming the SiGe mixed crystal layer $23_{1a}$, the Ge concentration therein is arranged so as to gradually increase in the direction from the lower side to the upper side, the increase being from 0% to 16%, for example. The Ge concentration gradient is preferably linear.

The formation process of the SiGeC mixed crystal layer $23_2$, the SiGeC mixed crystal layer $23_3$, and the SiGeC mixed crystal layer $23_{4a}$ are identical to the formation process described above; therefore, their descriptions are omitted.

Upon forming the SiGe mixed crystal layer $23_5$, the Ge concentration therein is arranged so as to gradually decrease in the direction from the lower side to the upper side, the decrease being from 16% to 0%, for example. Here, the Ge concentration gradient is also preferably in a linear line.

The base layer 23a made up of the SiGe/SiGeC layer of the Si/SiGe/SiGeC film 39a is formed in this manner.

Next, the cap layer 25 made up of Si doped with B is formed on the entire upper surface using the low-pressure epitaxial growth technique, for example. The thickness of this cap layer may be 30 nm, for example.

The subsequent fabrication processes of the heterobipolar transistor according to the present embodiment are identical to those previously described with reference to FIGS. 10A–10C, and FIGS. 11A–11C, and therefore, their descriptions are omitted. In the step previously described with reference to FIG. 11C, the n-type dopant impurity in the n$^+$ dispersion region 32 is dispersed into the Si layer 32a due to the thermal process performed therein. The collector layer 22a is formed by the n$^+$ dispersion region 32 and the Si layer 32a.

In this way, the heterobipolar transistor according to the third embodiment of the present invention is fabricated.

In the above, the descriptions of the preferred embodiments of the present invention have been given. It should be noted, however, that the present invention is not limited to the specific embodiments described above. Rather, various modifications and changes can be made without departing from the scope of the present invention, which is determined solely by the following claims.

What is claimed is:

1. A heterobipolar transistor comprising:
   an n-type silicon collector layer;
   a base layer formed on said n-type silicon collector layer and made of a p-type SiGeC mixed crystal layer doped with boron; and
   an n-type silicon emitter layer formed on the base layer and containing boron at a concentration exceeding $7 \times 10^{17}$ cm$^{-3}$;
   wherein at least a portion of said base layer including a boundary with said emitter layer has a higher concentration of boron than a concentration of carbon.

2. The heterobipolar transistor as claimed in claim 1, further comprising:
   a cap layer formed between said base layer and said emitter layer and made of silicon doped with boron;

wherein said cap layer contains an n-type dopant impurity at a concentration exceeding the concentration of the boron.

3. The heterobipolar transistor as claimed in claim 1, wherein said emitter layer contains carbon.

4. The heterobipolar transistor as claimed in claim 1, wherein said emitter layer is doped with phosphorous.

5. The heterobipolar transistor as claimed in claim 1, wherein said collector layer has a higher concentration of carbon than a concentration of boron in a region including a border with said base layer.

6. The heterobipolar transistor as claimed in claim 1, wherein said emitter layer substantially contains no germanium.

7. The heterobipolar transistor as claimed in claim 1, wherein said base layer has a first region on the emitter layer side in which a germanium concentration gradient exists, indicating a gradual decrease in the germanium concentration in a direction from said collector layer side to said emitter layer side.

8. The heterobipolar transistor as claimed in claim 7, wherein the germanium concentration gradient in said first region is virtually linear.

9. The heterobipolar transistor as claimed in claim 7, wherein the germanium concentration at the boundary of said base layer on said emitter layer side is 5% or below.

10. The heterobipolar transistor as claimed in claim 9, wherein the germanium concentration at the boundary of said base layer on said emitter layer side is 1% or below.

11. The heterobipolar transistor as claimed in claim 9, wherein the germanium concentration at the boundary of said base layer on said emitter layer side is substantially 0%.

12. The heterobipolar transistor as claimed in claim 1, wherein said base layer has a region in which the concentration of boron is within a range of $2 \times 10^{19}$–$8 \times 10^{19}$ cm$^{-3}$ and a region at least on the collector layer side in which the concentration of carbon is within a range of $7 \times 10^{19}$–$9 \times 10^{19}$ cm$^{-3}$.

13. The heterobipolar transistor as claimed in claim 1, wherein said base layer has a second region on said collector layer side in which a germanium concentration gradient exists, indicating a gradual increase in the Ge concentration in a direction from said collector layer side to said emitter layer side.

14. The heterobipolar transistor as claimed in claim 13, wherein said second region has a thickness of 16 nm or below.

15. The heterobipolar transistor as claimed in claim 13, wherein a distance between said second region and a region in which the concentration of boron is $1 \times 10^{19}$ cm$^{-3}$ or above in said base layer is 15 nm or below.

16. The heterobipolar transistor as claimed in claim 1, wherein said collector layer includes a silicon layer that is epitaxially grown on a substrate.

17. A heterobipolar transistor fabrication method comprising steps of:

forming an n-type collector layer by forming a first n-type silicon layer on a substrate;

forming a p-type base layer by depositing a SiGeC mixed crystal layer containing boron on said n-type collector layer so that the concentration of carbon exceeds the concentration of boron, and then continuing to deposit said SiGeC mixed crystal layer so that the concentration of boron exceeds the concentration of carbon; and forming an emitter layer by depositing a second n-type silicon layer on said p-type base layer.

18. The heterobipolar transistor fabrication method as claimed in claim 17, wherein said step of forming said p-type base layer further comprises a step of depositing a SiGe mixed crystal layer after the deposition of said SiGeC mixed crystal layer for realizing a higher concentration of boron compared with the concentration of carbon.

19. The heterobipolar transistor fabrication method as claimed in claim 17, wherein said step of forming said p-type base layer further comprises a step of depositing another SiGeC mixed crystal layer on said n-type collector layer before the deposition of said SiGeC mixed crystal layer for realizing a higher concentration of carbon compared with the concentration of boron.

20. The heterobipolar transistor fabrication method as claimed in claim 17, wherein said step of forming said p-type base layer includes forming a germanium concentration gradient in a region including a boundary on said emitter layer side, indicating a gradual decrease in the germanium concentration in a direction from said n-type collector layer side to said emitter layer side.

21. The heterobipolar transistor fabrication method as claimed in claim 17, wherein said step of forming said p-type base layer includes forming another germanium concentration gradient in a region including a boundary on said n-type collector layer side, indicating a gradual increase in the germanium concentration in a direction from said n-type collector layer side to said emitter layer side.

22. The heterobipolar transistor fabrication method as claimed in claim 17, wherein said step of forming said emitter layer further comprises a step of depositing said second n-type silicon layer directly onto said p-type base layer.

23. The heterobipolar transistor fabrication method as claimed in claim 17, further comprising a step of forming a cap layer made up of silicon containing boron, said step being executed after the step of forming said p-type base layer and before the step of forming said emitter layer.

24. The heterobipolar transistor fabrication method as claimed in claim 17, wherein the steps of forming said first n-type silicon layer, depositing said SiGeC mixed crystal layer, and depositing said second n-type silicon layer are performed using a low-pressure CVD technique.

* * * * *